US012757405B2

(12) United States Patent
Lee et al.

(10) Patent No.: US 12,757,405 B2
(45) Date of Patent: Oct. 6, 2026

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Bong Yong Lee, Suwon-si (KR); Yong Seok Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 425 days.

(21) Appl. No.: 18/351,407

(22) Filed: Jul. 12, 2023

(65) Prior Publication Data

US 2024/0040795 A1 Feb. 1, 2024

(30) Foreign Application Priority Data

Jul. 26, 2022 (KR) ........................ 10-2022-0092505

(51) Int. Cl.
*H10B 51/20* (2023.01)
*H10B 51/10* (2023.01)
(Continued)

(52) U.S. Cl.
CPC ............. *H10B 51/20* (2023.02); *H10B 51/10* (2023.02); *H10D 30/0415* (2025.01); *H10D 30/701* (2025.01); *H10W 20/435* (2026.01)

(58) Field of Classification Search
CPC ........ H10B 51/20; H10B 51/10; H10B 51/50; H10B 51/30; H01L 23/5283; H10D 30/0415; H10D 30/701; H10D 64/689
See application file for complete search history.

(56) References Cited

U.S. PATENT DOCUMENTS 11,170,836 B1 11/2021 Tang
2014/0264532 A1* 9/2014 Dennison ........... H10D 30/0413 257/316

(Continued)

FOREIGN PATENT DOCUMENTS

KR 10-2022-0000799 A 1/2022

OTHER PUBLICATIONS

Office Action dated May 13, 2026 issued in the corresponding Korean Patent Application No. 10-2022-0092505.

*Primary Examiner* — Bitew A Dinke
(74) *Attorney, Agent, or Firm* — MORGAN, LEWIS & BOCKIUS LLP

(57) ABSTRACT

A semiconductor device comprises a substrate that extends in first and second directions and includes a cell region and an extension region that extends from the cell region in the first direction, first and second insulating layers alternately stacked on the substrate in a third direction, a conductive line disposed on one sidewall of the second insulating layer in the second direction, a conductive pillar that extends in the third direction and penetrates through the first insulating layer, a semiconductor layer disposed on one sidewall of the conductive pillar and that extends in the third direction, and a ferroelectric layer disposed between the conductive line and the semiconductor layer and that extends in the third direction. The conductive line includes first and second conductive patterns spaced apart from each other in the second direction, and the second insulating layer is disposed between the first and second conductive patterns.

16 Claims, 21 Drawing Sheets

(51) Int. Cl.

| | |
|---|---|
| ***H10D 30/01*** | (2025.01) |
| ***H10D 30/69*** | (2025.01) |
| ***H10W 20/41*** | (2026.01) |

(56) References Cited

U.S. PATENT DOCUMENTS

| | | | | |
|---|---|---|---|---|
| 2016/0071861 | A1* | 3/2016 | Serov | H10B 41/35 438/257 |
| 2017/0084623 | A1* | 3/2017 | Sharangpani | H10D 89/10 |
| 2019/0123061 | A1* | 4/2019 | Liu | G11C 11/2273 |
| 2020/0075631 | A1 | 3/2020 | Dong et al. | |
| 2021/0036020 | A1* | 2/2021 | Park | H10B 51/30 |
| 2021/0375927 | A1* | 12/2021 | Chia | G11C 11/5657 |
| 2021/0375935 | A1 | 12/2021 | Ling et al. | |
| 2021/0407569 | A1 | 12/2021 | Wu et al. | |
| 2021/0407848 | A1* | 12/2021 | Chia | H10B 51/20 |
| 2022/0005830 | A1 | 1/2022 | Wu et al. | |
| 2022/0020770 | A1* | 1/2022 | Yang | G11C 11/223 |
| 2022/0020771 | A1* | 1/2022 | Yang | H01L 21/76802 |
| 2022/0037253 | A1* | 2/2022 | Yang | H10B 43/20 |
| 2022/0037361 | A1* | 2/2022 | Lin | H10D 30/025 |
| 2022/0037362 | A1* | 2/2022 | Lin | H10D 30/0415 |
| 2022/0052060 | A1* | 2/2022 | Young | G11C 7/18 |
| 2022/0223622 | A1* | 7/2022 | Chien | G11C 11/2255 |
| 2022/0231049 | A1* | 7/2022 | Lin | H10B 51/20 |
| 2022/0285395 | A1* | 9/2022 | Yang | H10B 51/30 |
| 2023/0063038 | A1* | 3/2023 | Young | H10B 51/10 |
| 2023/0065891 | A1* | 3/2023 | Ling | H10D 30/0415 |

* cited by examiner

SEMICONDUCTOR DEVICE AND METHOD OF FABRICATING THE SAME

CROSS-REFERENCE TO RELATED APPLICATION

This application claims priority under 35 U.S.C. 119 from Korean Patent Application No. 10-2022-0092505, filed on Jul. 26, 2022 in the Korean Intellectual Property Office, the contents of which are herein incorporated by reference in their entirety.

TECHNICAL FIELD

Embodiments of the present disclosure are directed to a semiconductor device and a method of fabricating the same, and more particularly, to a semiconductor device that includes ferroelectrics and a method of fabricating the same.

DISCUSSION OF THE RELATED ART

The degree of integration of a semiconductor device has been gradually increased to meet performance and cost demands of consumers. For a planar or two-dimensional semiconductor device, since the degree of integration is mainly determined by an area occupied by a unit cell, the semiconductor device is affected by the technology of forming fine patterns.

However, as a design rule of a semiconductor device is reduced, there are limitations in forming fine patterns due to limitations of resolution in a process of forming patterns for implementing a semiconductor device. Accordingly, three-dimensional semiconductor devices in which cells are three-dimensionally arranged have been proposed.

BRIEF SUMMARY

Embodiments of the present disclosure provide a semiconductor device and a method of fabricating the same, in which the number of processes that form a three-dimensionally arranged ferroelectric field effect transistor are reduced.

Embodiments of the present disclosure provide a semiconductor device and a method of fabricating the same, in which resistance characteristics of a three-dimensionally arranged ferroelectric field effect transistor are improved.

A semiconductor device according to some embodiments of the present disclosure comprises a substrate that extends in first and second directions that cross each other, where the substrate includes a cell region and an extension region that extends from the cell region in the first direction, first and second insulating layers alternately stacked on the substrate in a third direction that crosses the first and second directions, a conductive line disposed on one sidewall of the second insulating layer in the second direction, a conductive pillar that extends in the third direction and penetrates through the first insulating layer, a semiconductor layer disposed on one sidewall of the conductive pillar and that extends in the third direction, and a ferroelectric layer disposed between the conductive line and the semiconductor layer and that extends in the third direction. The conductive line includes first and second conductive patterns spaced apart from each other in the second direction, and the second insulating layer is disposed between the first and second conductive patterns.

A semiconductor device according to some embodiments of the present disclosure comprises a substrate that includes a cell region that extends in first and second directions that cross each other and includes a ferroelectric memory cell formed thereon, and an extension region that extends from the cell region in the first direction, a first conductive line that extends in the first direction on the substrate, a plurality of second conductive lines spaced apart from the first conductive line in the second direction and spaced apart from each other in the first direction, a ferroelectric layer disposed between one sidewall of the first conductive line and the plurality of second conductive lines and that extends in the first direction, a semiconductor layer disposed between the ferroelectric layer and the plurality of second conductive lines and that extends in the first direction, and an isolation plug disposed between the plurality of second conductive lines. The first conductive line includes a plurality of first and second conductive patterns spaced apart from each other in the second direction, and a silicon material layer that extends in the first direction and is disposed between the first and second conductive patterns.

A method of fabricating a semiconductor device according to some embodiments of the present disclosure comprises forming a stacked structure on a substrate, where the stacked structure includes an insulating layer and a sacrificial layer that are alternately stacked, and the substrate includes a cell region and an extension region, forming first and second trenches that penetrate through at least a portion of the stacked structure and are spaced apart from each other in a first direction, and a third trench between the first and second trenches, forming a sacrificial pattern that has a smaller width than the sacrificial layer by partially removing the sacrificial layer, forming a first conductive line that includes first and second conductive patterns that are spaced apart from each other on both sidewalls of the sacrificial pattern, respectively forming a ferroelectric layer, a semiconductor layer and a first dielectric layer in the first to third trenches, forming an opening that penetrates through the first dielectric layer and the semiconductor layer in the third trench, forming a second dielectric layer within the opening, and forming a plurality of second conductive layers by respectively removing the first dielectric layers from the first and second trenches.

DETAILED DESCRIPTION

Hereinafter, a semiconductor device according to some embodiments will be described with reference to FIGS. 1 to 6.

Figure 1:
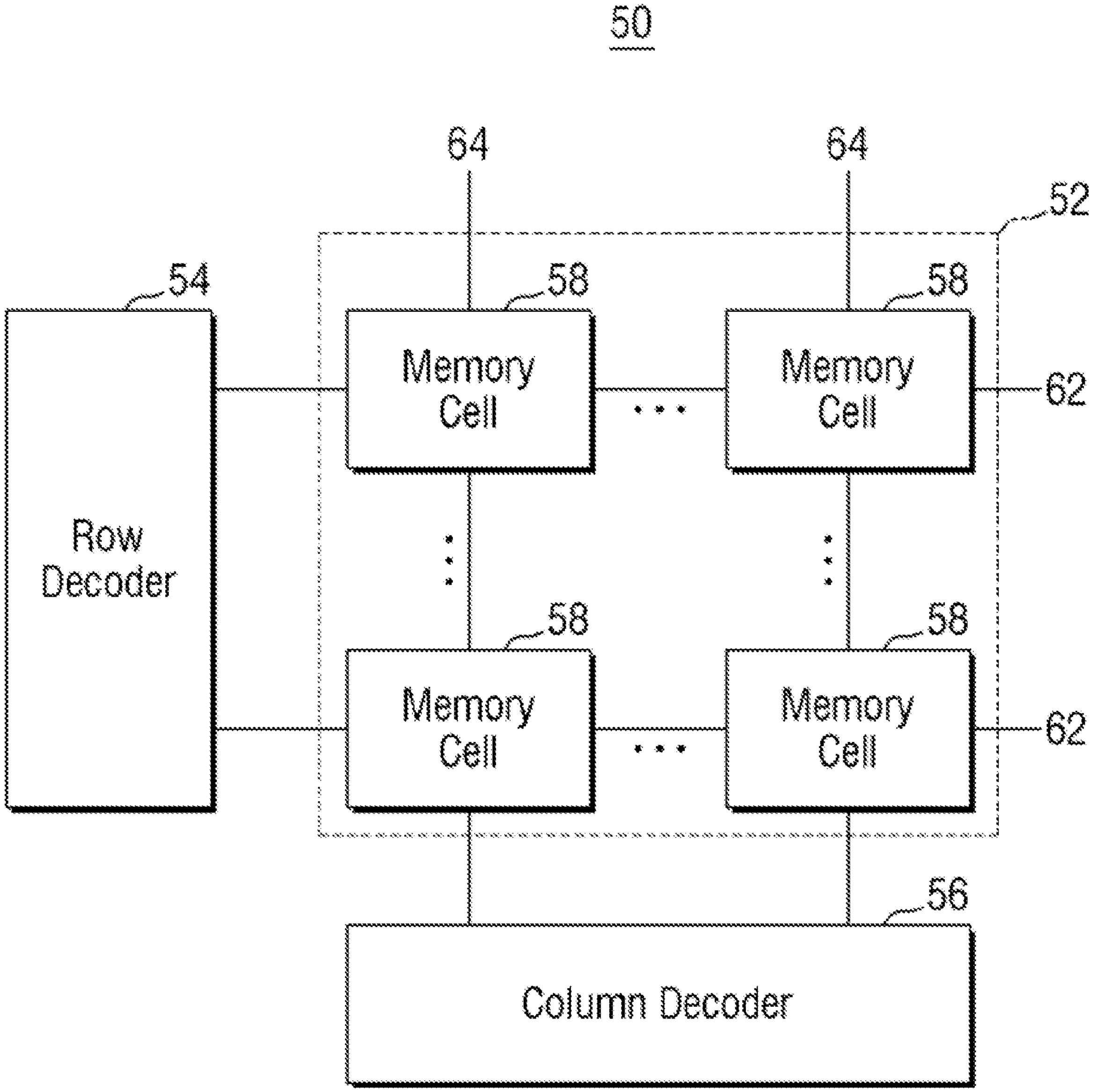
FIG. 1 is a block diagram of a semiconductor device according to some embodiments.
Figure 2:
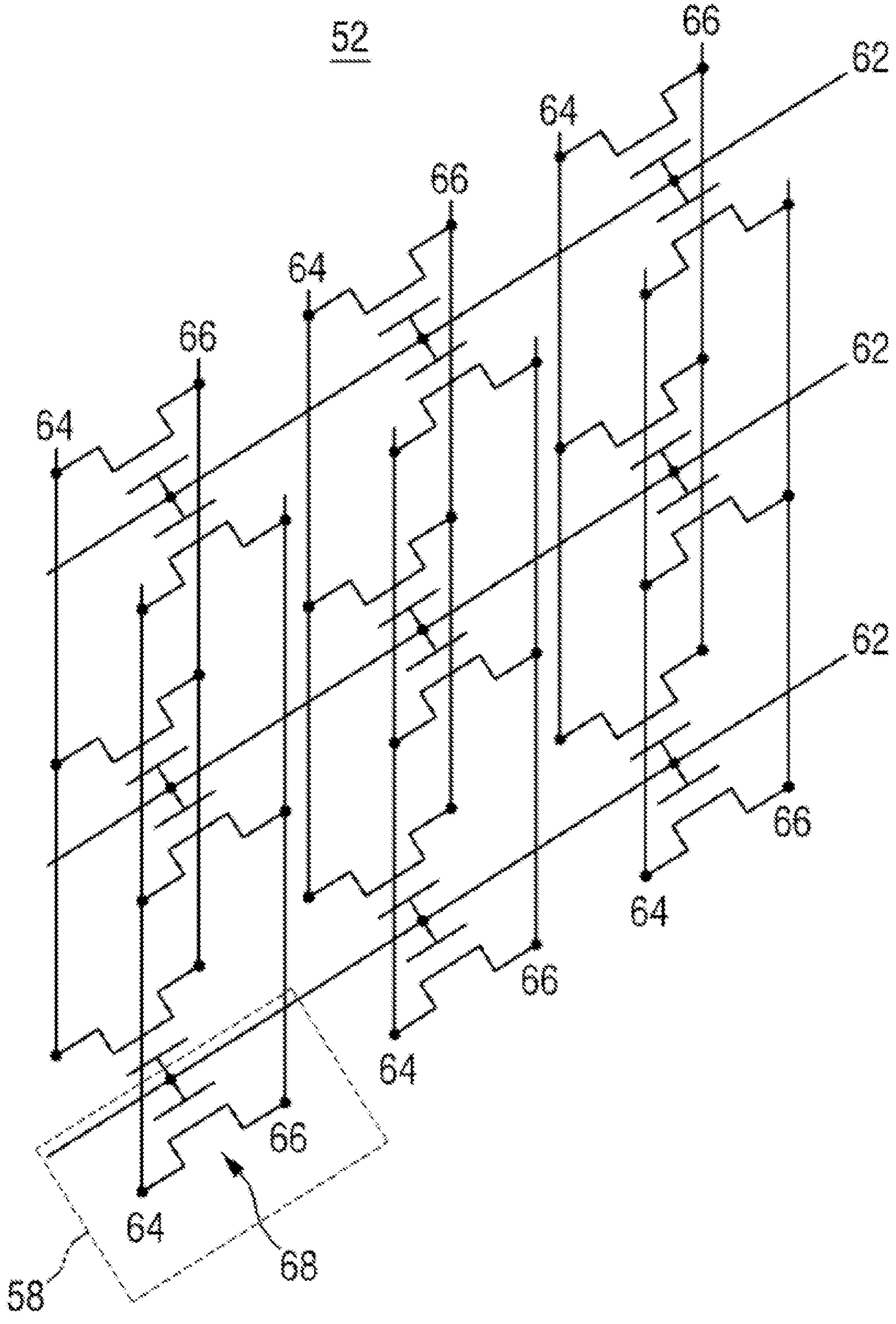
FIG. 2 is a circuit diagram of a semiconductor device according to some embodiments.
Figure 3:
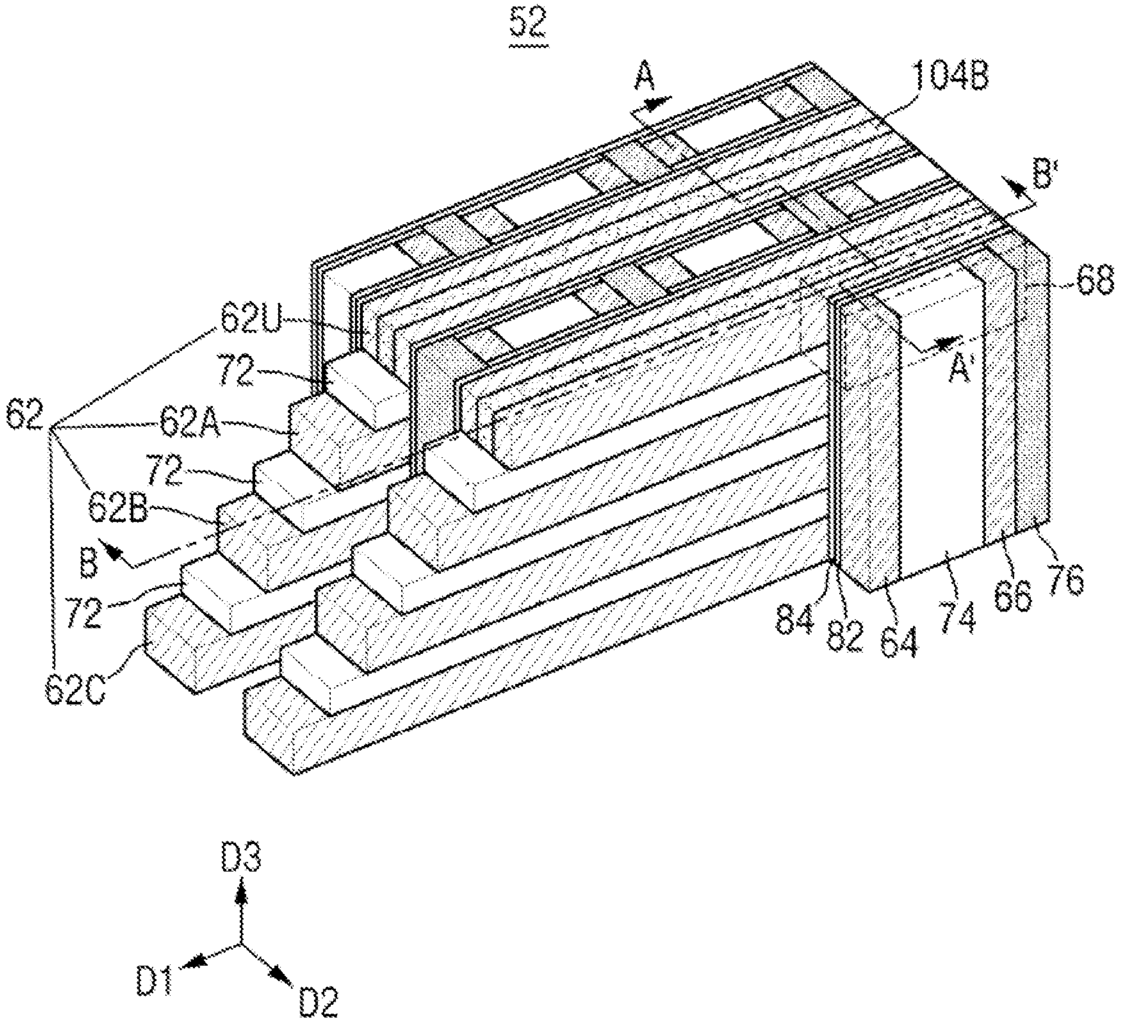
FIG. 3 is a schematic perspective view of a semiconductor device according to some embodiments.
Figure 4:
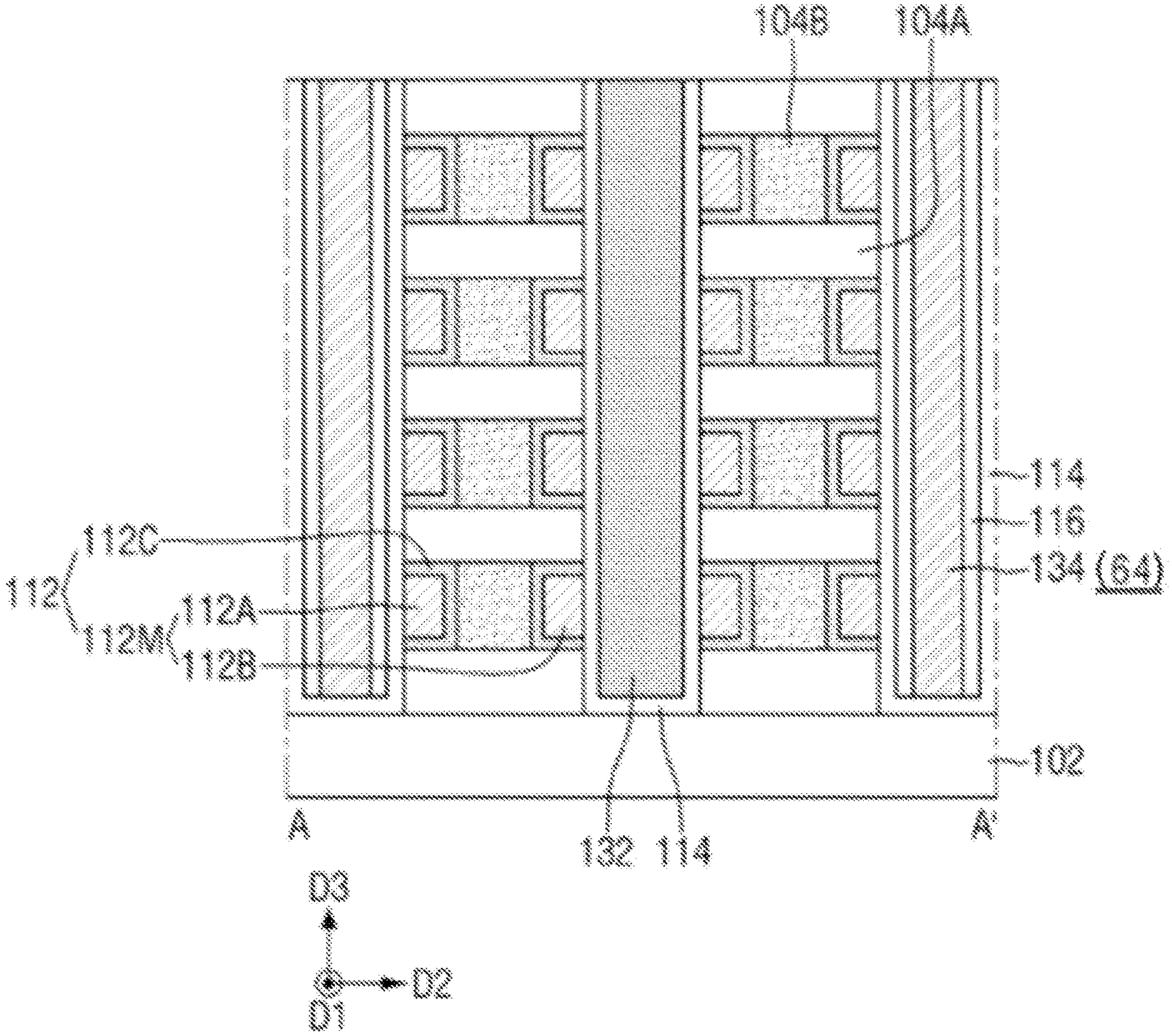
FIG. 4 is a cross-sectional view taken along line A-A' of FIG. 3.
Figure 5:
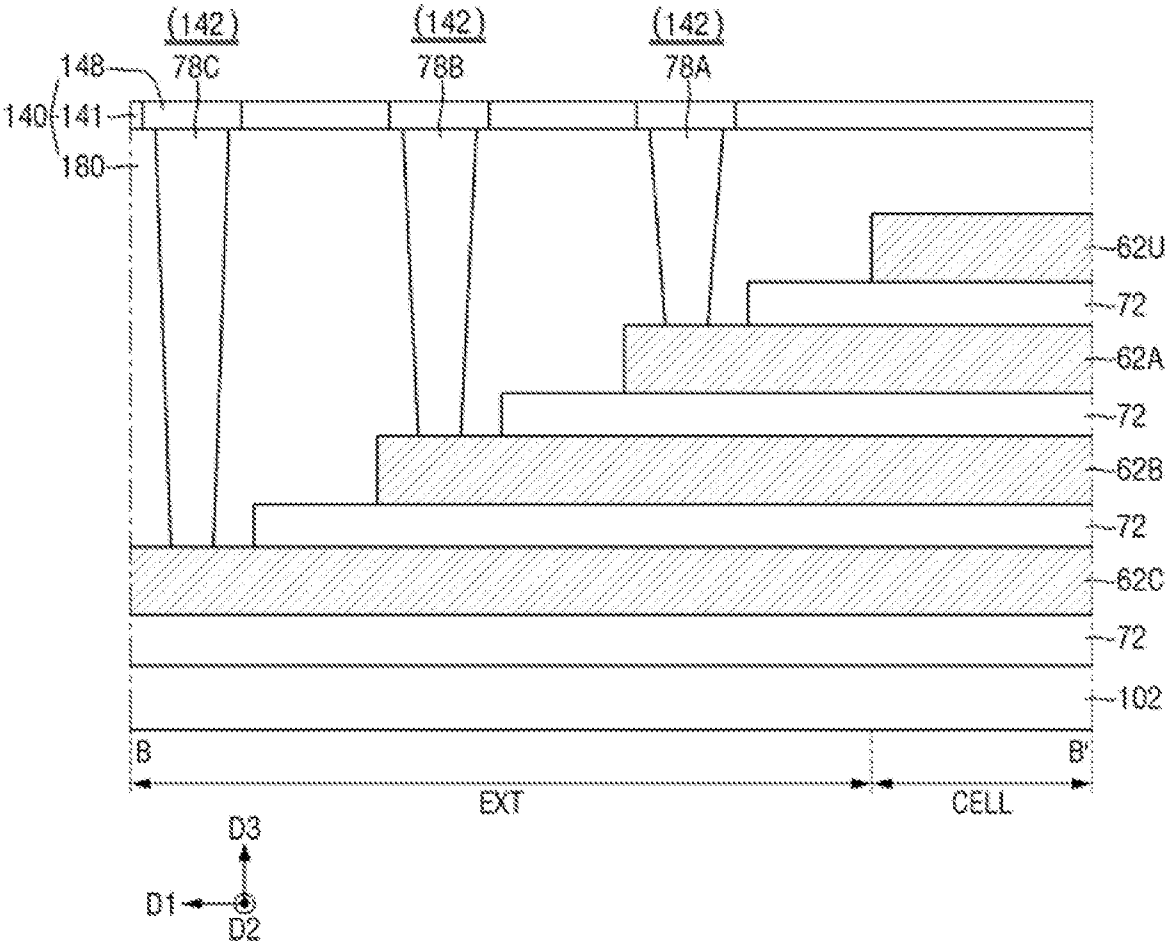
FIG. 5 is a cross-sectional view taken along line B-B' of FIG. 3.
Figure 6:
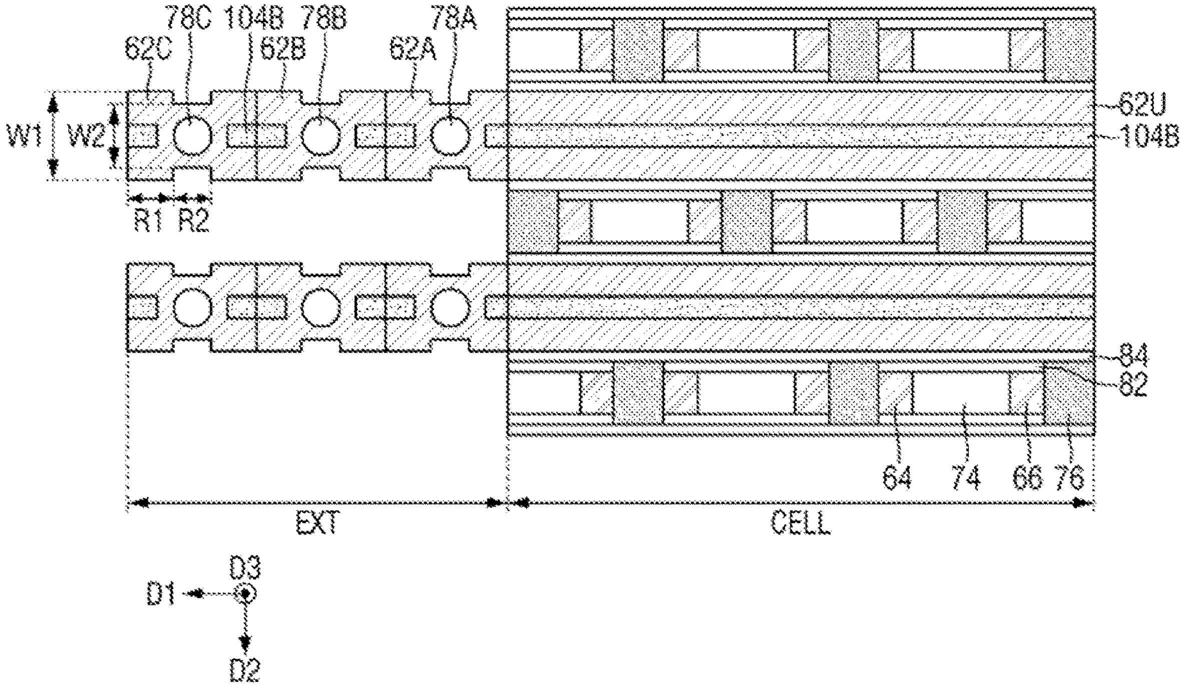
FIG. 6 is a schematic layout view of a semiconductor device according to some embodiments.

FIG. 1 is a block diagram of a semiconductor device according to some embodiments. FIG. 2 is a circuit diagram of a semiconductor device according to some embodiments. FIG. 3 is a schematic perspective view of a semiconductor device according to some embodiments. FIG. 4 is a cross-sectional view taken along line A-A' of FIG. 3. FIG. 5 is a cross-sectional view taken along line B-B' of FIG. 3. FIG. 6 is a schematic layout view of a semiconductor device according to some embodiments.

Referring to FIG. 1, the semiconductor device according to some embodiments is a random access memory 50. The random access memory 50 includes a memory array 52, a row decoder 54, and a column decoder 56.

The memory array 52 includes a memory cell 58, a word line 62, and a bit line 64. The memory cell 58 are arranged in rows and columns. The word line 62 and the bit line 64 are electrically connected to the memory cell 58. The word line 62 is a conductive line that extends along the row of the memory cell 58. The bit line 64 is a conductive line that extends along the column of the memory cell 58.

The row decoder 54 selects a desired memory cell 58 from the row of the memory array 52 by activating the word line 62 for the row. The column decoder 56 selects the bit line 64 for the desired memory cell 58 from the column of the memory array 52 of the selected row, reads data from the selected memory cell 58 by using the bit line 64, or writes the data in a cell.

Referring to FIG. 2, in an embodiment, the memory array 52 includes a plurality of memory cells 58 arranged in a matrix of rows and columns. Since the memory cells 58 are vertically stacked in a three-dimensional memory array, the degree of integration of the semiconductor device is increased. The memory array 52 is disposed in a back end of line (BEOL) of a semiconductor die.

The semiconductor device according to some embodiments is a three-dimensional non-volatile memory device, and includes a ferroelectric field effect transistor (FeFET).

Each memory cell 58 includes a transistor 68. A gate of each transistor 68 is electrically connected to each word line 62, a first source/drain region of each transistor 68 is electrically connected to each bit line 64, and a second source/drain region of each transistor 68 is electrically connected to a source line 66. The memory cells 58 in the same horizontal row of the memory array 52 share a common word line, and the memory cells 58 in the same vertical column of the memory array 52 share a common source line and a common bit line.

Referring to FIG. 3, in an embodiment, the memory array 52 includes word lines 62 and a plurality of insulating layers 72 disposed between adjacent word lines 62. The word lines 62 include a plurality of word lines 62U, 62A, 62B and 62C that are vertically stacked. The number of word lines 62 and the number of insulating layers 72 are not limited to those shown, and may be provided in various numbers.

The word lines 62U, 62A, 62B and 62C extend in a first direction D1 parallel with an upper surface of a substrate (102 of FIG. 4). The word lines 62U, 62A, 62B and 62C extends from a cell region CELL (see FIG. 5) to an extension region EXT (see FIG. 5), and have a stepwise shape in the extension region such that the lowermost word line 62C is longer than the uppermost word line 62U. The word line 62 corresponds to a first conductive line 112 that will be described below.

Some of the word lines 62A, 62B and 62C are connected to respective word line contacts 78A, 78B and 78C in the extension region EXT (see FIG. 5). The word line contacts 78A, 78B and 78C are formed in exposed portions of the respective word lines 62A, 62B and 62C. The word line contacts 78A, 78B and 78C correspond to the first contact 142 that are connected to each word line 62 and extend in a third direction D3 on each word line 62.

The plurality of bit lines 64 and the source lines 66 are disposed between the word lines 62 adjacent in second direction D2 that crosses the first direction D1. Each of the bit line 64 and the source line 66 extends in a third direction D3 perpendicular to the first direction D1. The bit line 64 corresponds to a second conductive line 134 that will be described below, and the source line 66 corresponds to a third conductive line 136.

An isolation layer 74 is disposed between adjacent bit lines 64 and source lines 66 to isolate them. The word line 62, the bit line 64 and the source line 66 that cross each other define each memory cell 58. The isolation layer 74 includes a dielectric material such as silicon oxide, but is not necessarily limited thereto.

A dielectric plug 76 is disposed between adjacent bit lines 64 and sources line 66 to isolate them. The bit line 64 and the source line 66 are electrically connected to a ground. The dielectric plug 76 corresponds to an isolation plug 132 that will be described below.

A semiconductor layer 82 provides a channel region for the transistor 68 of the memory cell 58. For example, when an appropriate voltage, such as a voltage higher than each threshold voltage of the corresponding transistor 68, is applied through the corresponding word line 62, a region of the semiconductor layer 82 that crosses the word line 62 allows a current to flow along the first direction D1 from the bit line 64 to the source line 66.

Each semiconductor layer 82 is in contact with one surface of each corresponding word line 62 to provide a planar channel region for the transistor 68. According to some embodiments, the semiconductor layer 82 provides a three-dimensional channel region for the transistor 68 by being in contact with a plurality of surfaces of the corresponding word line 62. The semiconductor layer 82 is disposed between the isolation layer 74 and a ferroelectric layer 84 that will be described below.

The ferroelectric layer 84 is disposed between the word line 62 and the semiconductor layer 82. The ferroelectric layer 84 provides a gate dielectric for the transistor 68. The ferroelectric layer 84 includes, for example, at least one of hafnium oxide, zirconium oxide, hafnium zirconium oxide, or their combination.

To perform a write operation in the memory cell 58, a write voltage is applied to a portion of the ferroelectric layer 84 that corresponds to the memory cell 58. The write voltage is applied, for example, by applying an appropriate voltage to a corresponding word line 62, a corresponding bit line 64, and a source line 66. The write operation of the memory cell 58 i applies a predetermined write voltage to the word line 62 to implement different residual polarizations in the ferroelectric layer 84, and stores the different residual polarizations as signal information.

To perform a read operation for the memory cell 58, a read voltage, such as voltage between a low threshold voltage and a high threshold voltage, is applied to the corresponding word line 62. The read operation of the memory cell 58 changes the threshold voltage of the field effect transistor in accordance with a size or orientation of the residual polarization stored in the ferroelectric layer 84.

Referring to FIGS. 4 to 6, in some embodiments, a semiconductor device described in FIG. 3 is disposed on the substrate 102. For example, a semiconductor device according to some embodiments includes a substrate 102, a first insulating layer 104A, a second insulating layer 104B, a first conductive line 112, a second conductive line 134, a third conductive line 136, a ferroelectric layer 114, a semiconductor layer 116, an isolation plug 132, a first contact 142, a second contact 144 (see FIGS. 20 and 21), a third contact 146 (see FIGS. 20 and 21), and an interlayer insulating layer 180.

The substrate 102 extends in the first direction D1 and the second direction D2. The first direction D1 and the second direction D2 are parallel to the upper surface of the substrate 102 and cross each other. The third direction D3 is perpendicular to each of the first direction D1 and the second direction D2.

The substrate 102 includes a cell region CELL in which a ferroelectric field effect transistor is disposed, and an extension region EXT that extends from the cell region CELL in the first direction D1. The first conductive line 112, which will be described below, is disposed in the extension region EXT in a stepwise shape.

The substrate 102 includes a semiconductor substrate such as a silicon substrate, a germanium substrate, or a silicon-germanium substrate. Alternatively, the substrate 102 include a silicon-on-insulator (SOI) substrate or a germanium-on-insulator (GOI) substrate.

The first insulating layer 104A and the second insulating layer 104B are alternately stacked in the third direction D3. For example, the first insulating layer 104A includes silicon oxide, and the second insulating layer 104B includes silicon nitride.

The first conductive line 112 extends in the first direction D1 on the substrate 102. The first conductive line 112 is disposed on one sidewall of the second insulating layer 104B in the second direction D2.

The first conductive line 112 includes a main conductive layer 112M that includes first and second conductive patterns 112A and 112B spaced apart from each other. The second insulating layer 104B is disposed between the first and second conductive patterns 112A and 112B. The first conductive line 112 further includes an adhesive layer 112C disposed between the first conductive pattern 112A and the second insulating layer 104B and between the second conductive pattern 112B and the second insulating layer 104B.

The second conductive line 134 passes through the first insulating layer 104A. For example, the second conductive line 134 extends in the third direction D3 in a pillar shape. A plurality of second conductive lines 134 are spaced apart from each other in the first direction D1. The second conductive line 134 are spaced apart from the first conductive line 112 in the second direction D2.

The semiconductor layer 116 is disposed on one sidewall of the second conductive line 134, and extends in the third direction D3. The semiconductor layer 116 is disposed between the ferroelectric layer 114 and the plurality of second conductive lines 134 in the second direction D2.

The semiconductor layer 116 includes, for example, one of doped polysilicon, doped silicon, silicon germanium (SiGe), or a semiconductor material formed through selective epitaxial growth (SEG), but is not necessarily limited thereto, and may include an oxide semiconductor material. The oxide semiconductor material is, for example, at least one of IGZO, Sn-IGZO, IWO, $CuS_2$, $CuSe_2$, $WSe_2$, IZO, ZTO, or YZO, but is not necessarily limited thereto. For example, the semiconductor layer 116 include one of $MoS_2$, $MoSe_2$, or $WS_2$.

The ferroelectric layer 114 is disposed between the first conductive line 112 and the semiconductor layer 116, and extends in the third direction D3. The ferroelectric layer 114 is disposed between one sidewall of the first conductive line 112 and the second conductive line 134 in the second direction D2.

The ferroelectric layer 114 includes, for example, at least one of hafnium oxide, zirconium oxide, hafnium zirconium oxide, or their combination. In addition, the ferroelectric layer 114 may include a ferroelectric material that has a perovskite structure, such as one of PZT($PbZr_xTi_{1-x}O_3$), $BaTiO_3$ or $PbTiO_3$. The ferroelectric layer 114 includes at least one dopant selected from carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), or lanthanum (La). The ferroelectric layer 114 is formed of a crystalline material. For example, the ferroelectric layer 114 has an orthorhombic crystalline structure.

Although FIG. 4 only shows the second conductive line 134, the description of the second conductive line 134 made with reference to FIG. 4 equally applies to the third conductive line 136.

The isolation plug 132 is disposed between the plurality of second conductive lines 134, and extends in the third direction D3. The isolation plug 132 is disposed between the plurality of second conductive lines 134 in the first direction D1. The isolation plug 132 includes an insulating material. For example, the isolation plug 132 includes silicon oxide, but is not necessarily limited thereto. The ferroelectric layer 114 is disposed between the lower end of the isolation plug 132 and the substrate 102.

The first contact 142, which corresponds to word line contacts 78A, 78B and 78C, is disposed on the first conductive line 112, which corresponds to the word line 62, and is connected to the first conductive line 112, and extends in the third direction D3. The first contact 142 is a via that electrically connects an upper line structure 140 with the first conductive line 112.

The second contact 144 (see FIG. 21) is disposed on the second conductive line 134 and is connected to the second conductive line 134, and extends in the third direction D3. The second contact 144 is a via that electrically connects the upper line structure 140 with the second conductive line 134.

Referring to FIG. 6, in an embodiment, in a plan view, the word line 62 includes an uneven structure. For example, in the second direction D2, a width of each of the word lines 62A, 62B and 62C of the extension region EXT differs from that of the word line 62U of the cell region CELL.

The word lines 62A, 62B and 62C of the extension region EXT include a first region R1 in which the word line contacts 78A, 78B and 78C are not formed and a second region R2 in which the word line contacts 78A, 78B and 78C are formed. A width W1 in the second direction D2 of the first region R1 is greater than a width W2 in the second direction D2 of the second region R2.

In addition, the second insulating layer 104B is disposed in the first region R1 of the word lines 62A, 62B and 62C, but is not disposed in the second region R2 thereof. A plurality of second insulating layers 104B are spaced apart from each other in the first direction D1.

In a process that partially removes a sacrificial layer described below, more of the sacrificial layer is removed from the second region R2 than from the first region R1, so that the sacrificial layer in the extension region EXT does not remain where the word line contact is formed.

According to some embodiments, no insulating layer such as a silicon nitride layer is formed in a region where a word line contact is formed, whereby resistance characteristics of the word line contact are improved.

Figure 7:
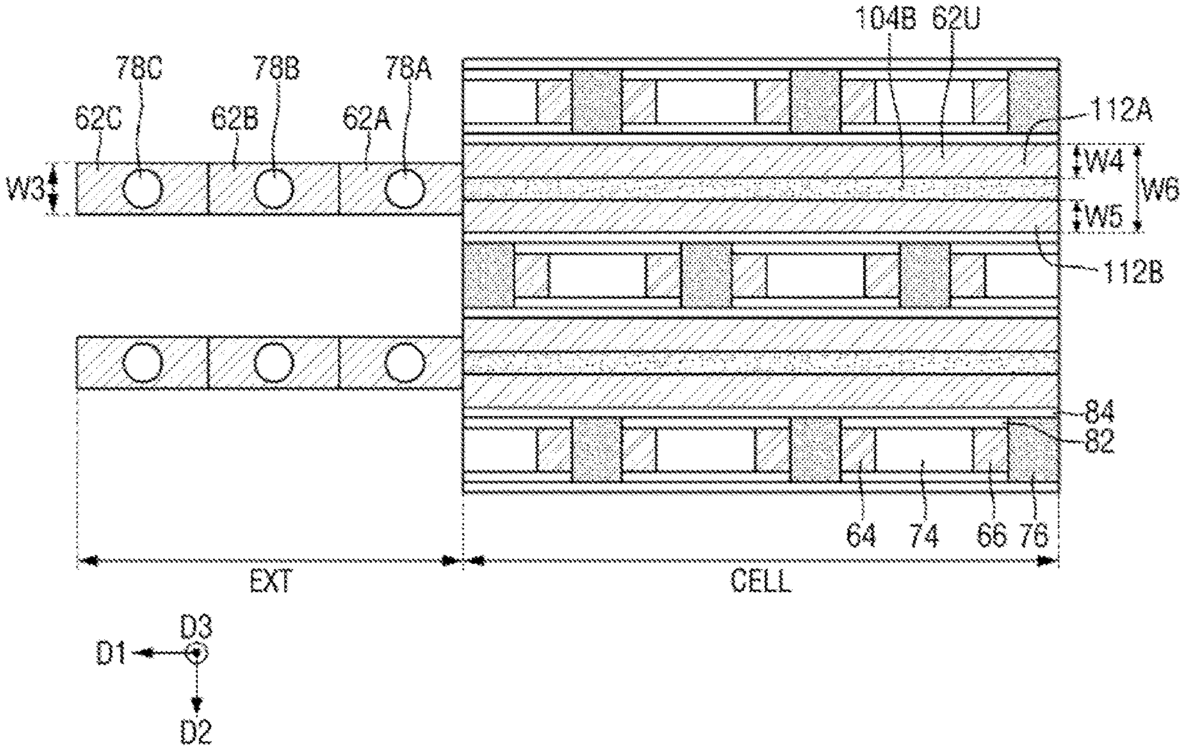
FIG. 7 is a schematic layout view of a semiconductor device according to some embodiments.

FIG. 7 is a schematic layout view of a semiconductor device according to some embodiments. For convenience of description, descriptions of components made with reference to FIGS. 1 to 6 may be omitted.

Referring to FIG. 7, in an embodiment, in the second direction D2, a width W3 of the word lines 62A, 62B and 62C in the extension region EXT is less than a sum W6 of a width of the word line 62U and a width of a second insulating layer 104B in the cell region CELL.

In the second direction D2, the width W3 of the word lines 62A, 62B and 62C in the extension region EXT is less than or equal to a sum of a width W4 of the first conductive pattern 112A in the cell region CELL and a width W5 of the second conductive pattern 112B in the cell region CELL.

For example, the second insulating layer 104B is disposed in the cell region CELL but not in the extension region EXT.

In the second direction D2, the widths W4 of the first conductive pattern 112A and W5 of the second conductive pattern 112B in the cell region CELL refer to lengths W4 and W5 where the sacrificial layer is removed in a process that partially removes the sacrificial layer. For example, the length (the sum of W4 and W5) of the region where the sacrificial layer is removed is greater than or equal to the width W3 of the word lines 62A, 62B and 62C in the extension region EXT so that no sacrificial layer remains in the extension region EXT.

FIGS. 8 to 21 illustrate intermediate steps of a method of fabricating a semiconductor device according to some embodiments. For convenience of description, descriptions of components described with reference to FIGS. 1 to 7 may be omitted. FIGS. 8, 10, 12, 14, 16, 18 and 20 are three-dimensional views of a memory array 52. FIGS. 9, 11, 13, 15, 17, 19 and 21 are cross-sectional views taken along the C-C' of FIG. 18.

Figure 8:
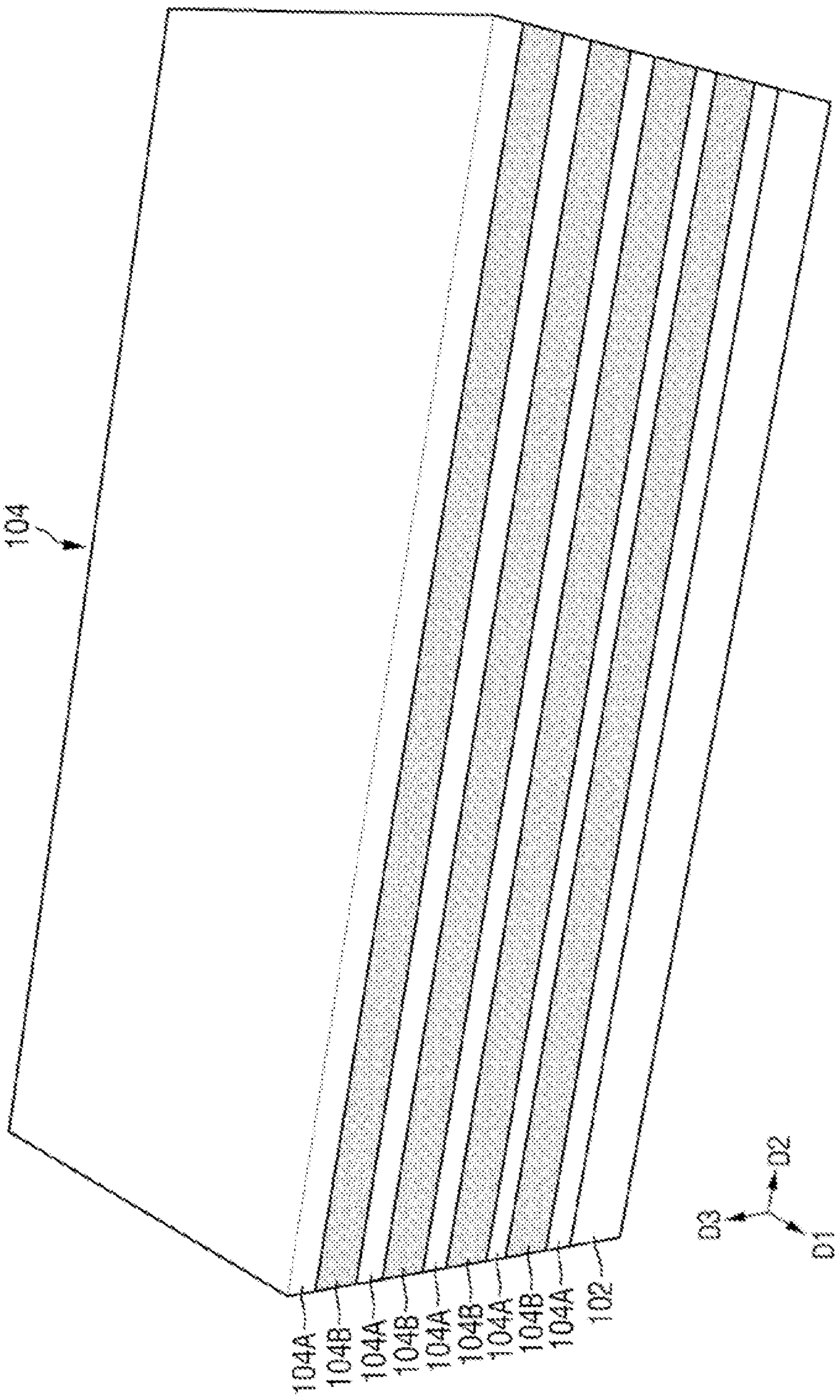
FIGS. 8 to 21 illustrate intermediate steps of a method of fabricating a semiconductor device according to some embodiments.
Figure 9:
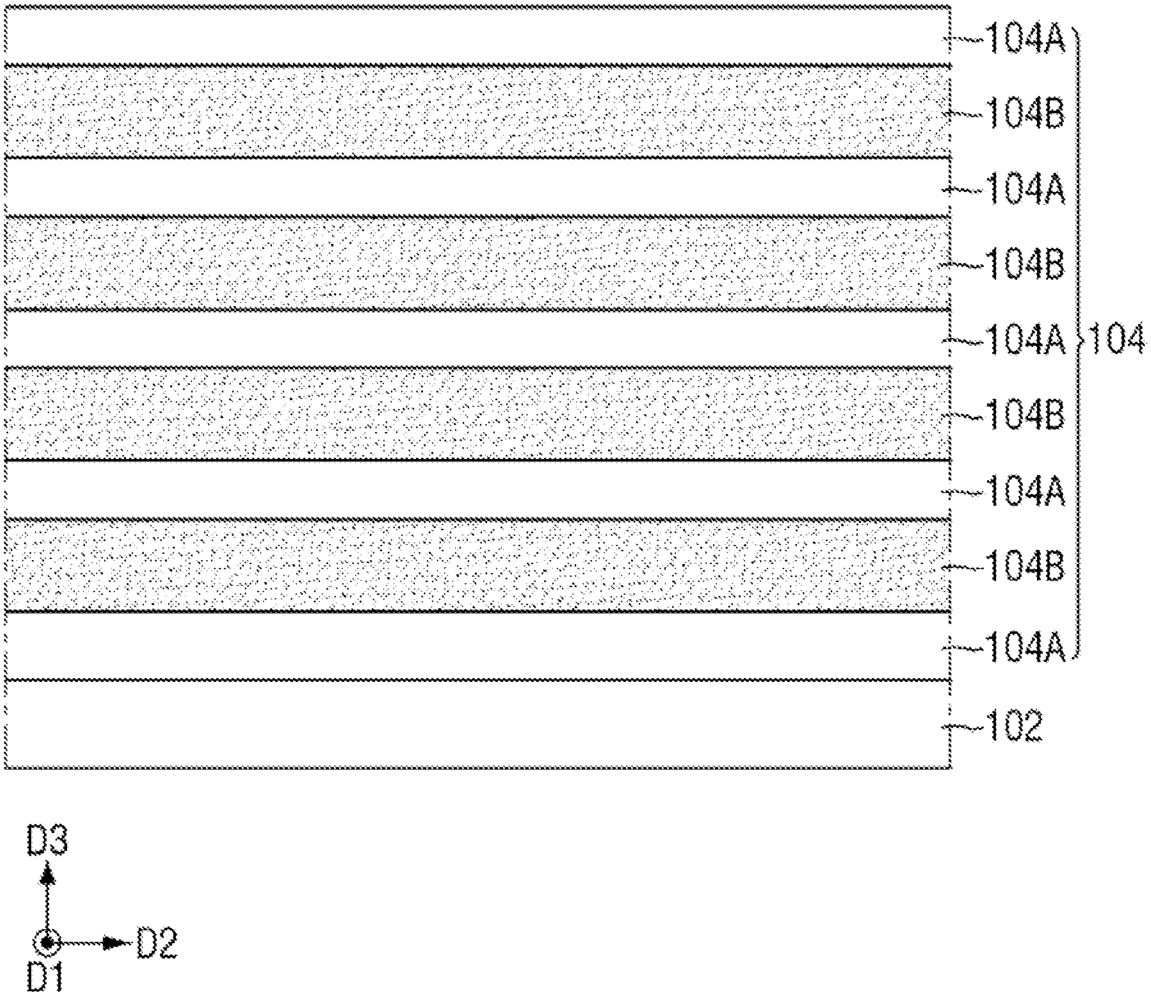

Referring to FIGS. 8 and 9, in some embodiments, a stacked structure 104 is formed on a substrate 102. The stacked structure 104 includes a first insulating layer 104A and a second insulating layer 104B that are alternately disposed. The substrate 102 includes a cell region CELL and an extension region EXT as described above.

Although FIGS. 8 and 9 show the stacked structure 104 as including five first insulating layers 104A and four second insulating layers 104B, embodiments of the present disclosure are not necessarily limited thereto. The number of first insulating layers 104A and second insulating layers 104B in the stacked structure 104 may different from those illustrated in the drawing. Further, the thicknesses of the substrate 102, the first insulating layer 104A and the second insulating layer 104B are not necessarily limited to those shown in this drawing.

The material included in the first insulating layer 104A and the second insulating layer 104B has a high etch selectivity with respect to the material included in the substrate 102.

The second insulating layer 104B serves as a sacrificial layer, and at least a portion thereof is removed and replaced with a word line of the transistor 68 as described below. The material included in the second insulating layer 104B has a high etch selectivity with respect to the material included in the first insulating layer 104A.

For example, the second insulating layer 104B includes at least one of silicon nitride, silicon oxynitride, silicon rich (Si-rich) nitride, or nanocrystalline silicon. In some embodiments, the second insulating layer 104B is referred to as a silicon material layer containing silicon.

For example, when the substrate 102 is formed of silicon carbide, the first insulating layer 104A includes silicon oxide and the second insulating layer 104B includes silicon nitride, but embodiments of the present disclosure are not necessarily limited thereto, and other combinations of dielectric materials with acceptable etch selectivity are used in other embodiments.

The first insulating layer 104A and the second insulating layer 104B of the stacked structure 104 are formed by a known deposition method such as chemical vapor deposition (CVD) and/or atomic layer deposition (ALD).

Figure 10:
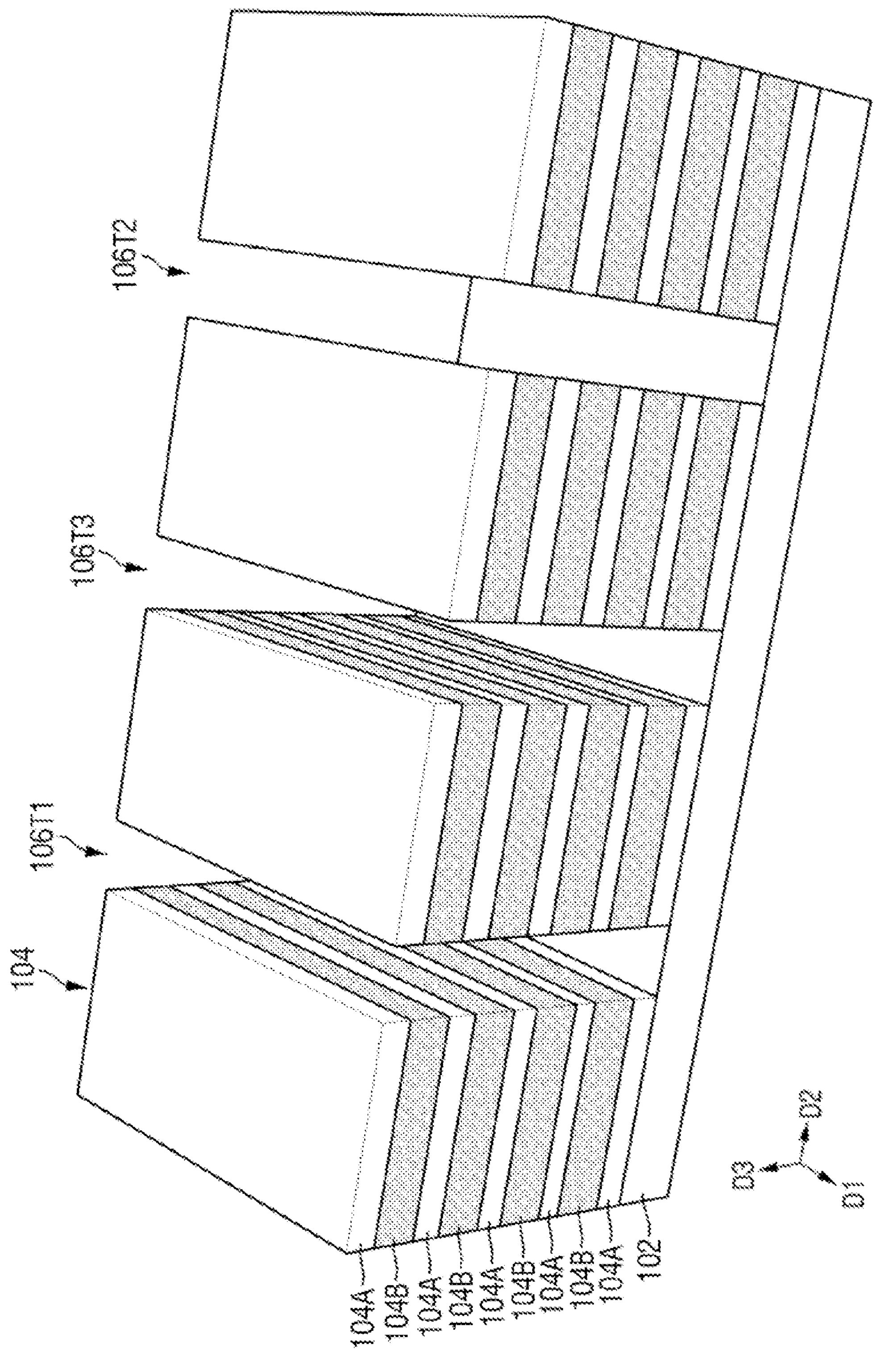
Figure 11:
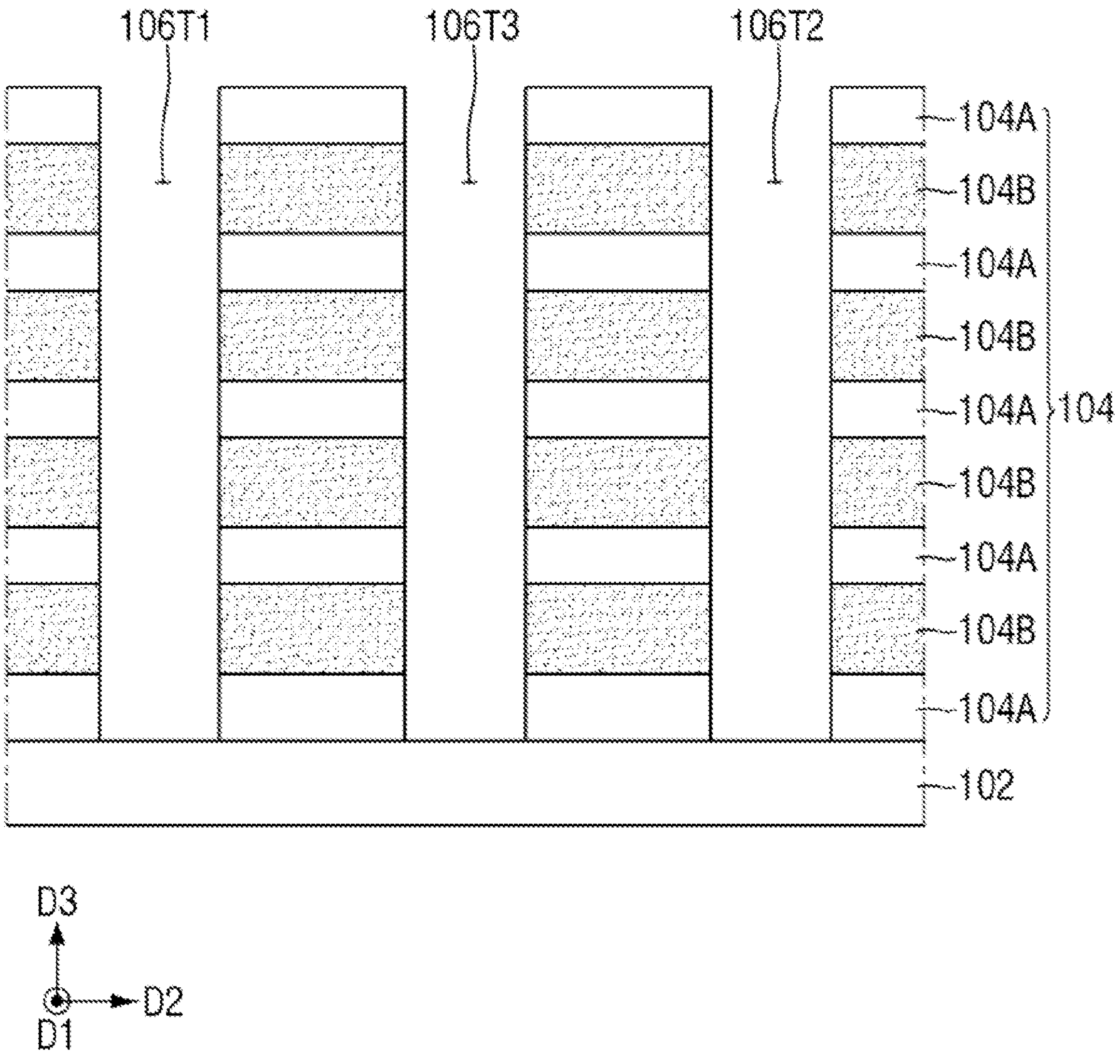

Referring to FIGS. 10 and 11, in some embodiment, the first to third trenches 106T1, 106T2 and 106T3 are formed in the stacked structure 104. The first and second trenches 106T1 and 106T2 penetrate through at least a portion of the stacked structure 104, and are spaced apart from each other in the first direction D1. The third trench 106T3 is disposed between the first and second trenches 106T1 and 106T2. For example, the second conductive line 134, which will be described below, is formed in the first and second trenches 106T1 and 106T2, and the isolation plug 132, which will be described below, is formed in the third trench 106T3.

The first to third trenches 106T1, 106T2 and 106T3 extend in the third direction D3 by penetrating through at least a portion of the stacked structure 104 and expose the substrate 102. The first to third trenches 106T1, 106T2 and 106T3 are formed through a selective etching process for the substrate 102.

For example, the first to third trenches 106T1, 106T2 and 106T3 are formed by etching the first insulating layer 104A and the second insulating layer 104B at a faster speed than the substrate 102. The etching process includes, for example, one or more known processes, such as a reactive ion etch (RIE) or a neutral beam etch (NBE), etc.

Figure 12:
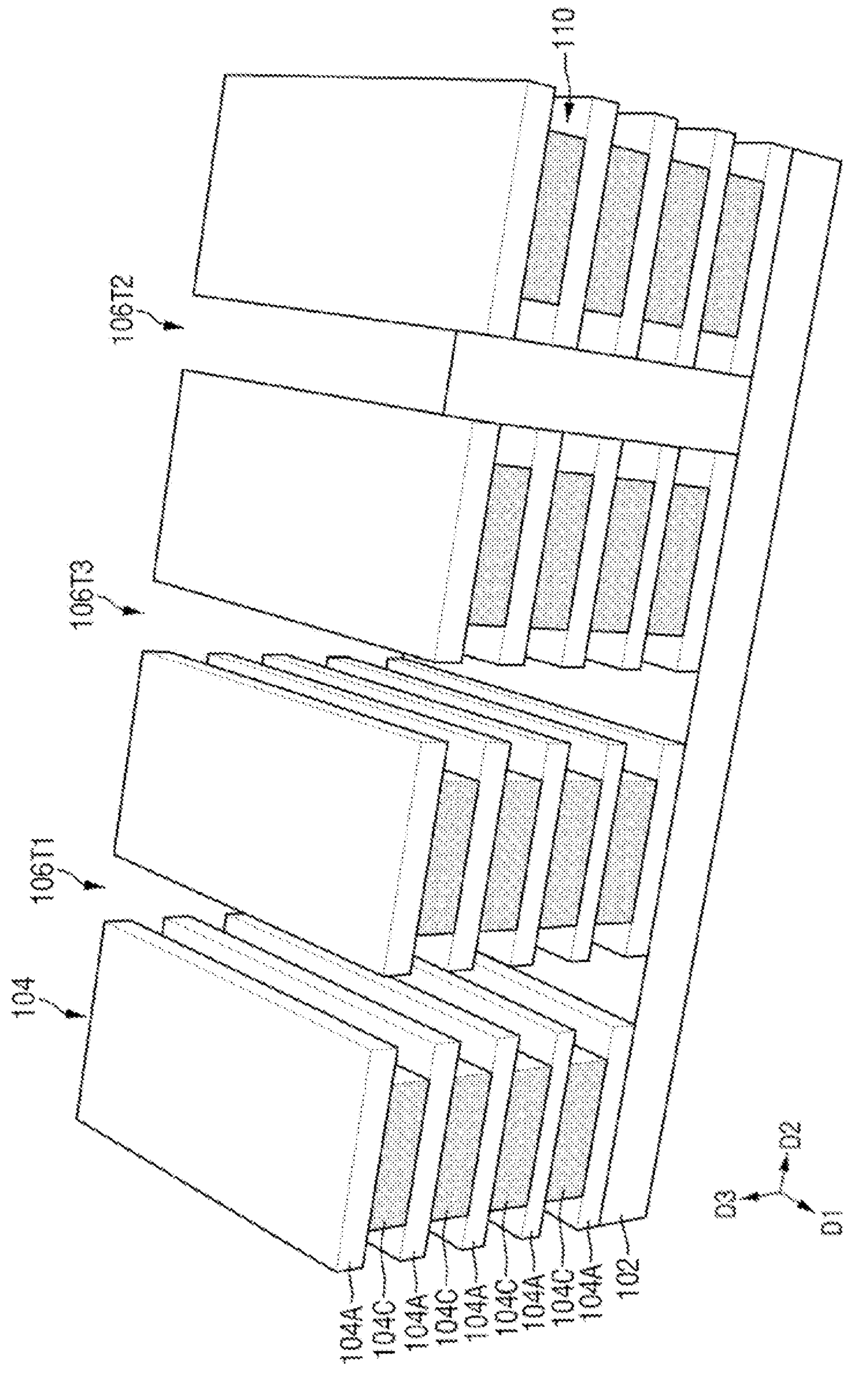
Figure 13:
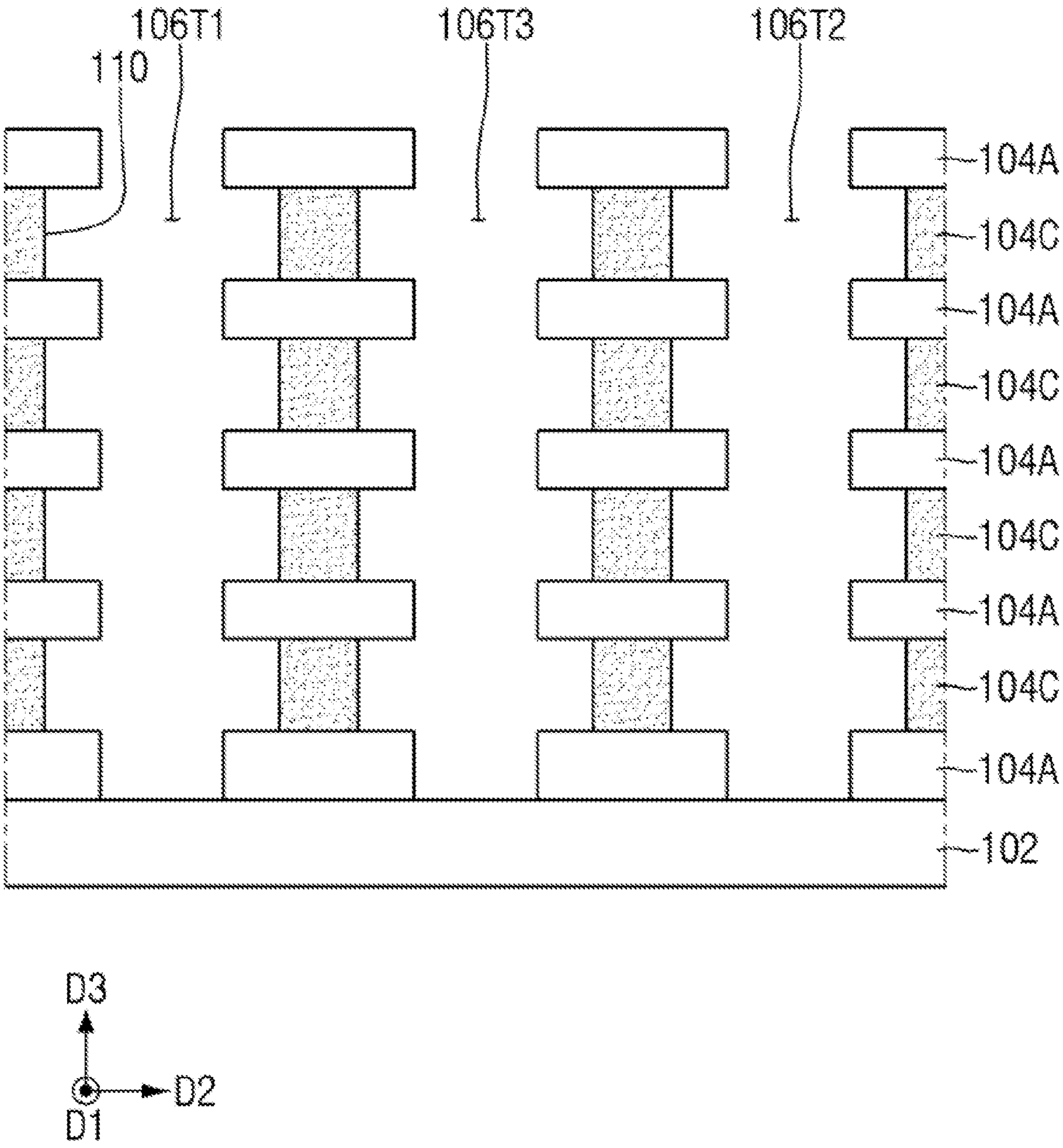

Referring to FIGS. 12 and 13, in some embodiments, at least a portion of the second insulating layer 104B is removed to form a sacrificial pattern 104C that has a recessed sidewall 110. The first to third trenches 106T1, 106T2 and 106T3 are enlarged to form the recessed sidewall 110. Therefore, the sacrificial pattern 104C whose width is smaller than that of the second insulating layer 104B is formed.

For example, a portion of the sidewall of the second insulating layer 104B exposed by the first to third trenches 106T1, 106T2 and 106T3 is removed to form the recessed sidewall 110. The recessed sidewall 110 is shown as having a straight line shape, but is not necessarily limited thereto, and the recessed sidewall may have a concave or convex curved shape in other embodiments.

The recessed sidewall 110 is formed using known etching processes for the second insulating layer 104B. For example, when the first insulating layer 104A is formed of silicon oxide and the second insulating layer 104B is formed of silicon nitride, the first to third trenches 106T1, 106T2 and 106T3 are expanded by an etching process that uses phosphoric acid ($H_3PO_4$).

Figure 14:
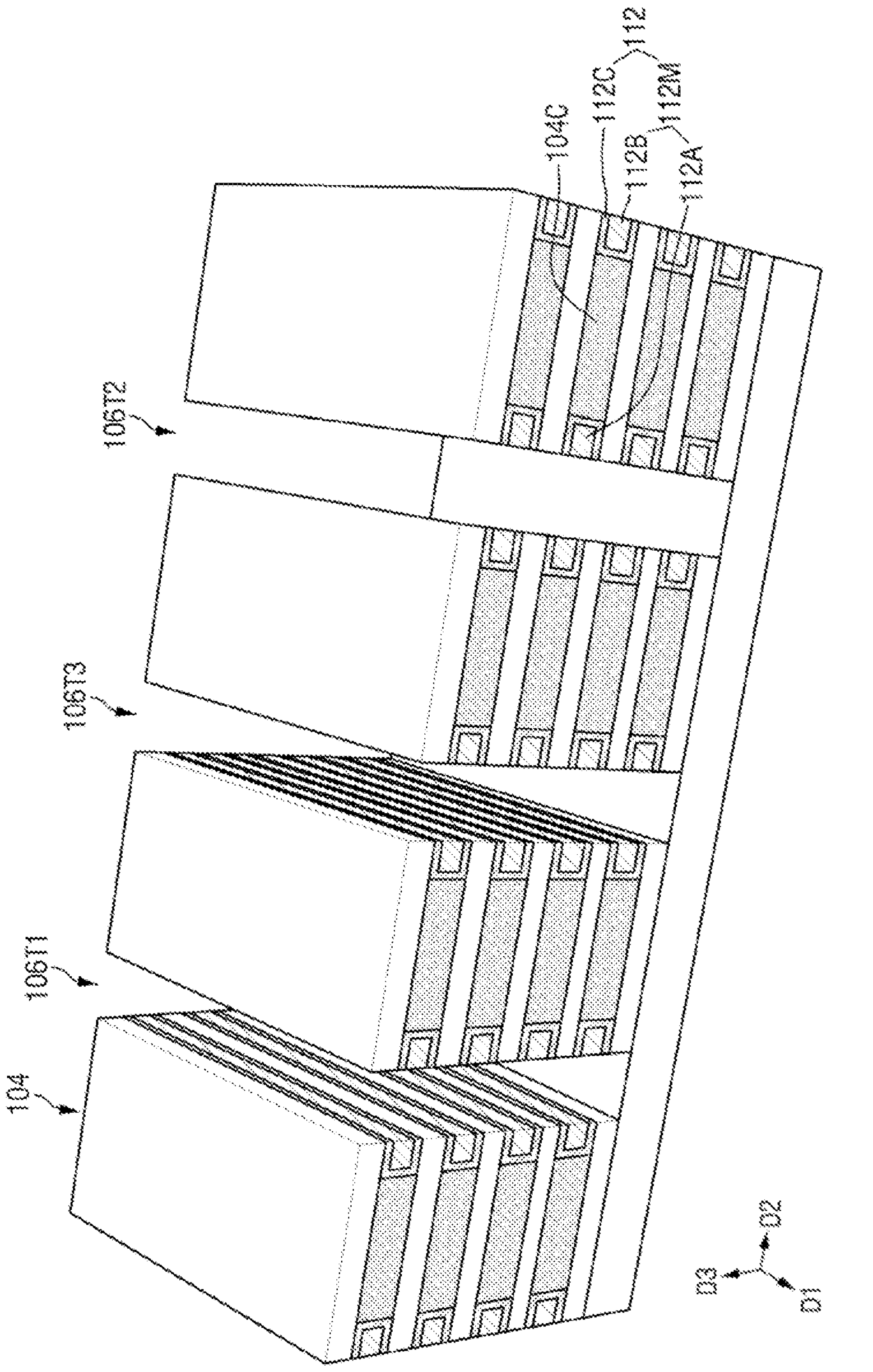
Figure 15:
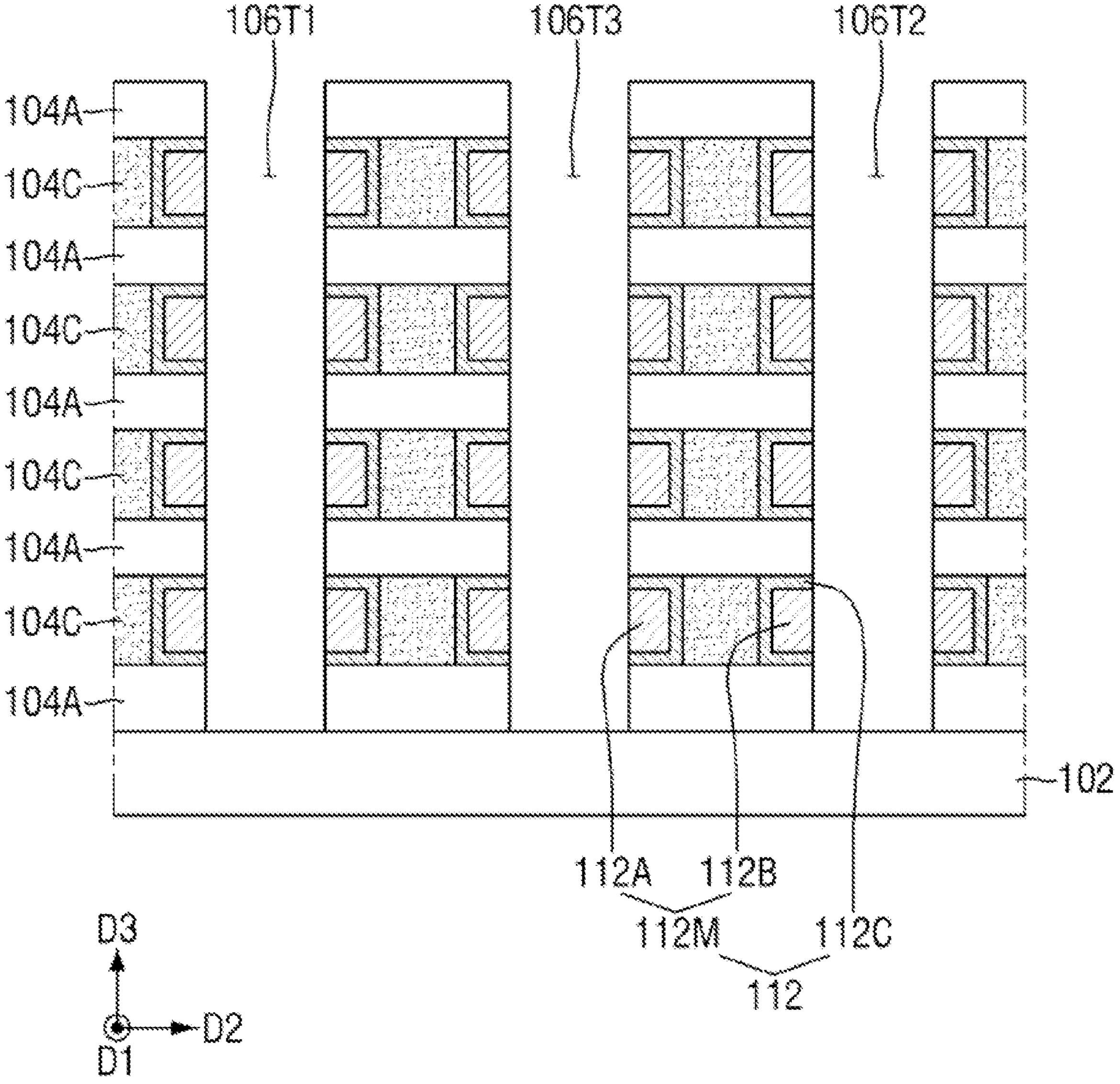

Referring to FIGS. 14 and 15, in some embodiments, the first conductive line 112 is formed in the recessed sidewall 110. A plurality of first conductive lines 112 are formed that are spaced apart from each other. A plurality of first conductive lines 112 adjacent to each other serve as a single word line 62.

The first conductive line 112 includes one or more main conductive layers 112M and adhesive layers 112C. The main conductive layer 112M include a first conductive pattern 112A and a second conductive pattern 112B that are spaced apart from each other in the second direction D2. The sacrificial pattern 104C is disposed between the first conductive pattern 112A and the second conductive pattern 112B.

Since the first conductive pattern 112A and the second conductive pattern 112B are a portion of the main conductive layer 112M, they include the same material. For example, the first conductive pattern 112A and the second conductive pattern 112B are formed of a conductive material such as at least one of tungsten (W), ruthenium (Ru), molybdenum (Mo), cobalt (Co), aluminum (Al), nickel (Ni), copper (Cu), silver (Ag), gold (Au), or their alloy.

The adhesive layer 112C is disposed between the first conductive pattern 112A and the sacrificial pattern 104C and between the second conductive pattern 112B and the sacrificial pattern 104C. The adhesive layer 112C is disposed along upper surfaces, one side and lower surfaces of the first conductive pattern 112A and the second conductive pattern 112B.

For example, the adhesive layer 112C is formed of a conductive material such as at least one of titanium nitride (TiN), tantalum nitride (TaN), molybdenum nitride, zirconium nitride or hafnium nitride. The adhesive layer 112C includes a material that has an adhesive force with respect to the first insulating layer 104A and the main conductive layer 112M.

The adhesive layer 112C and the main conductive layer 112M are formed by known deposition methods, such as one or more of chemical vapor deposition (CVD) and/or atomic layer deposition (ALD). A portion of surfaces of the adhesive layer 112C and the main conductive layer 112M are etched by a known etching process so that the adhesive layer 112C and the main conductive layer 112M are formed on the same plane as a sidewall of the first insulating layer 104A and the upper surface of the substrate 102.

Figure 16:
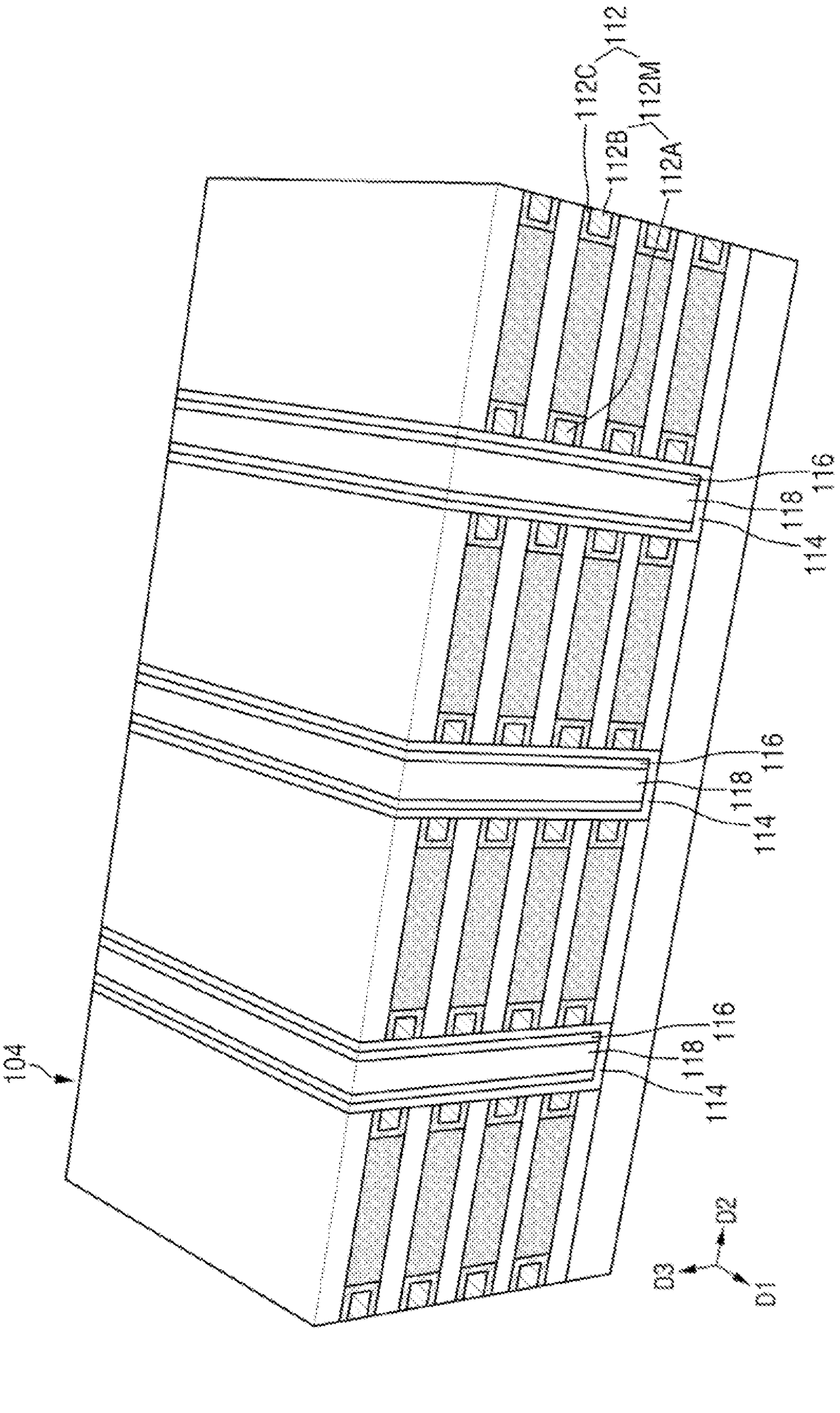
Figure 17:
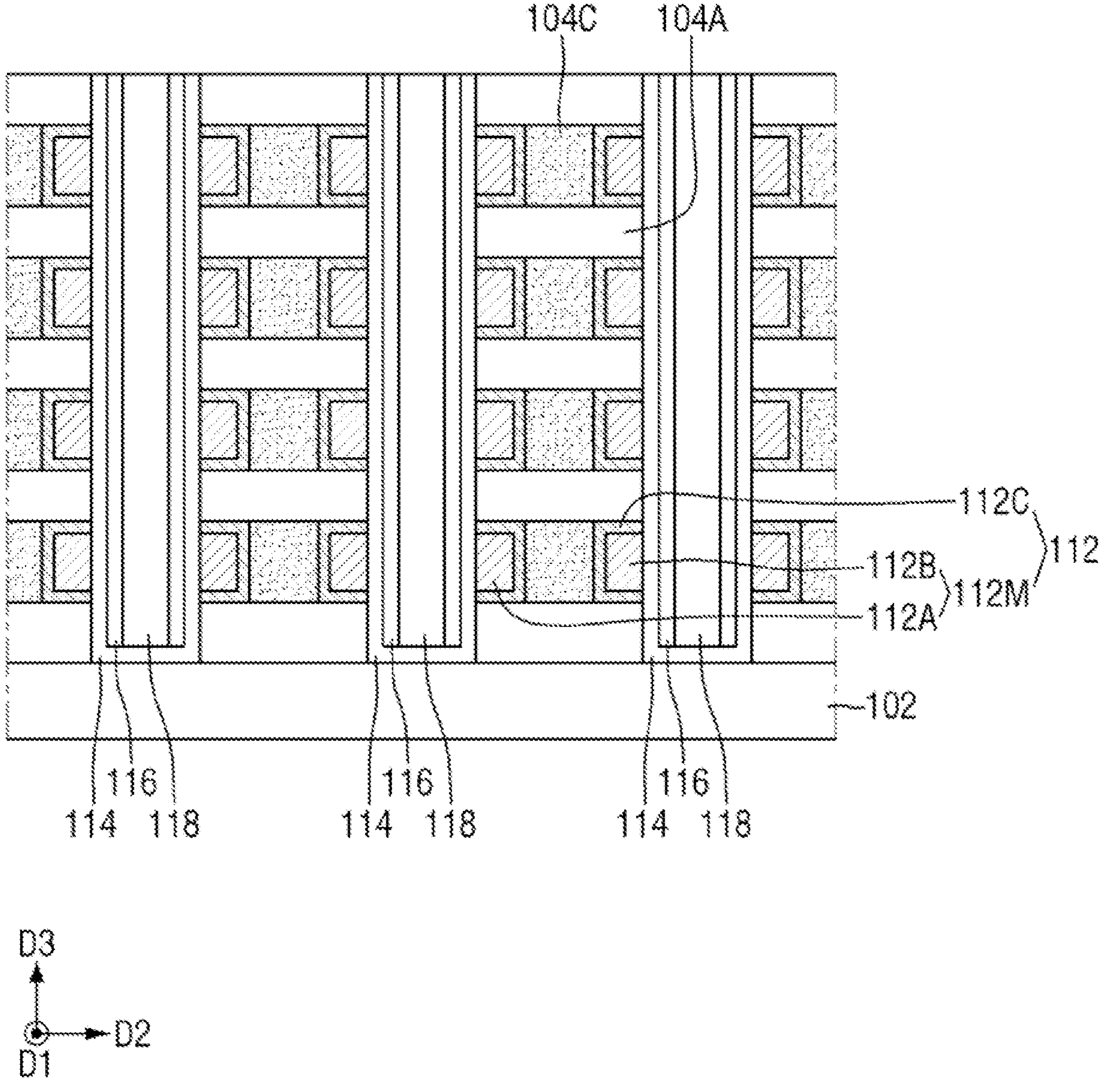

Referring to FIGS. 16 and 17, in some embodiments, the ferroelectric layer 114, the semiconductor layer 116, and a first dielectric layer 118 are formed in each of the first to third trenches 106T1, 106T2 and 106T3. For example, the ferroelectric layer 114 is conformally formed along sidewalls and bottom surfaces of the first to third trenches 106T1, 106T2 and 106T3. The semiconductor layer 116 is formed of two layers along sidewalls of the ferroelectric layer 114. The first dielectric layer 118 fills inner spaces of the first to third trenches 106T1, 106T2 and 106T3 along sidewalls of the semiconductor layer 116.

The ferroelectric layer 114 is a data storage layer formed of a ferroelectric material that stores digital values. The ferroelectric layer 114 is formed by a deposition process, such as one or more of chemical vapor deposition (CVD), atomic layer deposition (ALD) or physical vapor deposition (PVD).

The semiconductor layer 116 includes materials such as at least one of indium gallium zinc oxide (IGZO), indium tin oxide (ITO), indium gallium zinc tin oxide (IGZTO), zinc oxide (ZnO), polysilicon or amorphous silicon. The semiconductor layer 116 is formed of a semiconductor material that provides a channel region for the transistor 68. The semiconductor layer 116 is formed by a deposition process such as one or more of chemical vapor deposition (CVD), atomic layer deposition (ALD) or physical vapor deposition (PVD).

The first dielectric layer 118 is formed of a dielectric material. For example, the dielectric material includes one of an oxide such as silicon oxide or aluminum oxide, a nitride such as silicon nitride, a carbide such as silicon carbide, or their combination such as silicon oxynitride, silicon oxycarbide or silicon carbonitride. The first dielectric layer 118 is formed by a deposition process such as one or more of chemical vapor deposition (CVD), atomic layer deposition (ALD) or physical vapor deposition (PVD).

A planarization process is performed on the ferroelectric layer 114, the semiconductor layer 116 and the first dielectric layer 118. For example, the planarization process is one of a chemical mechanical polish (CMP) process, an etch back process, or their combination. Upper surfaces of the ferroelectric layer 114, the semiconductor layer 116 and the first dielectric layer 118 are made coplanar by the planarization process.

Figure 18:
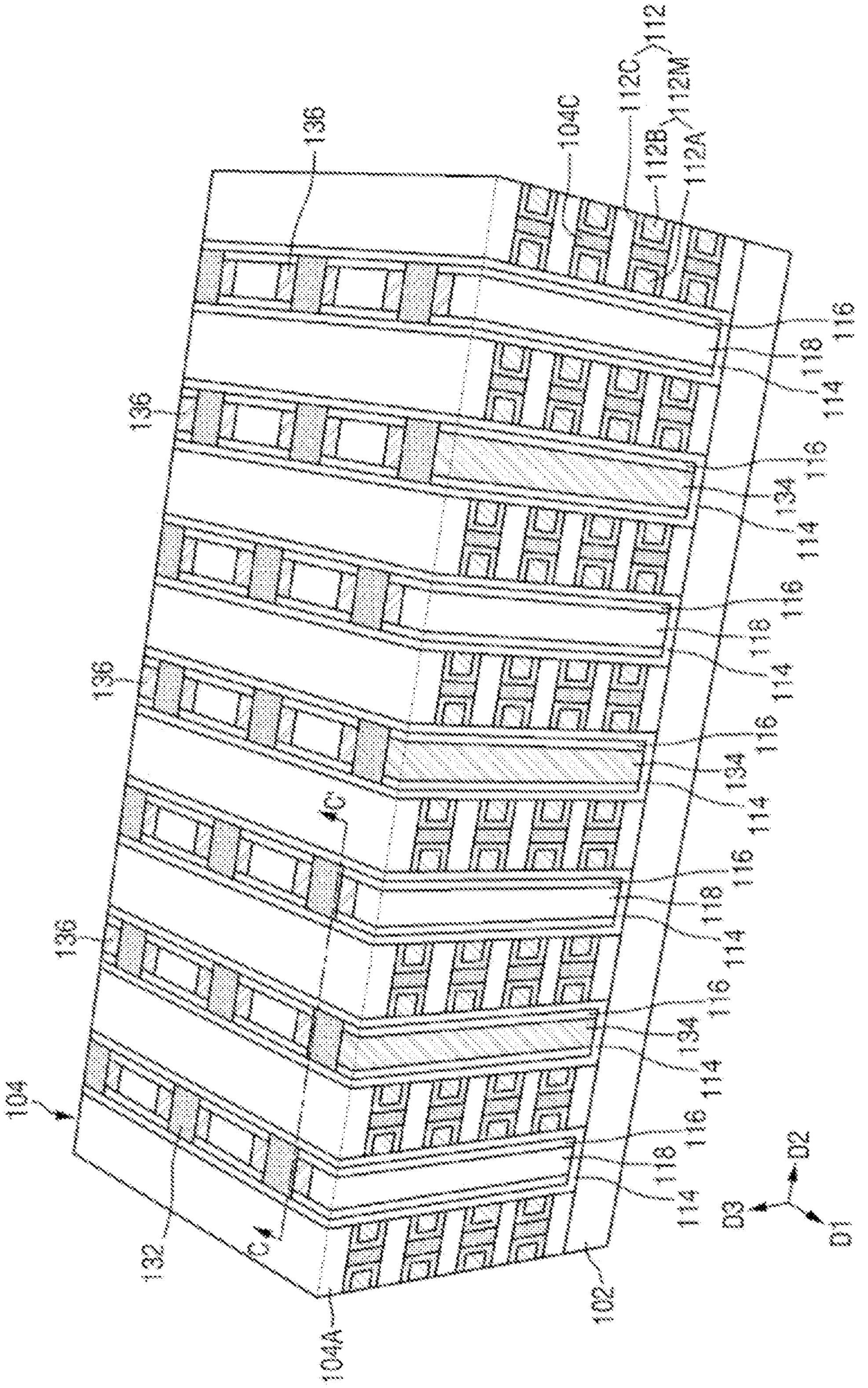
Figure 19:
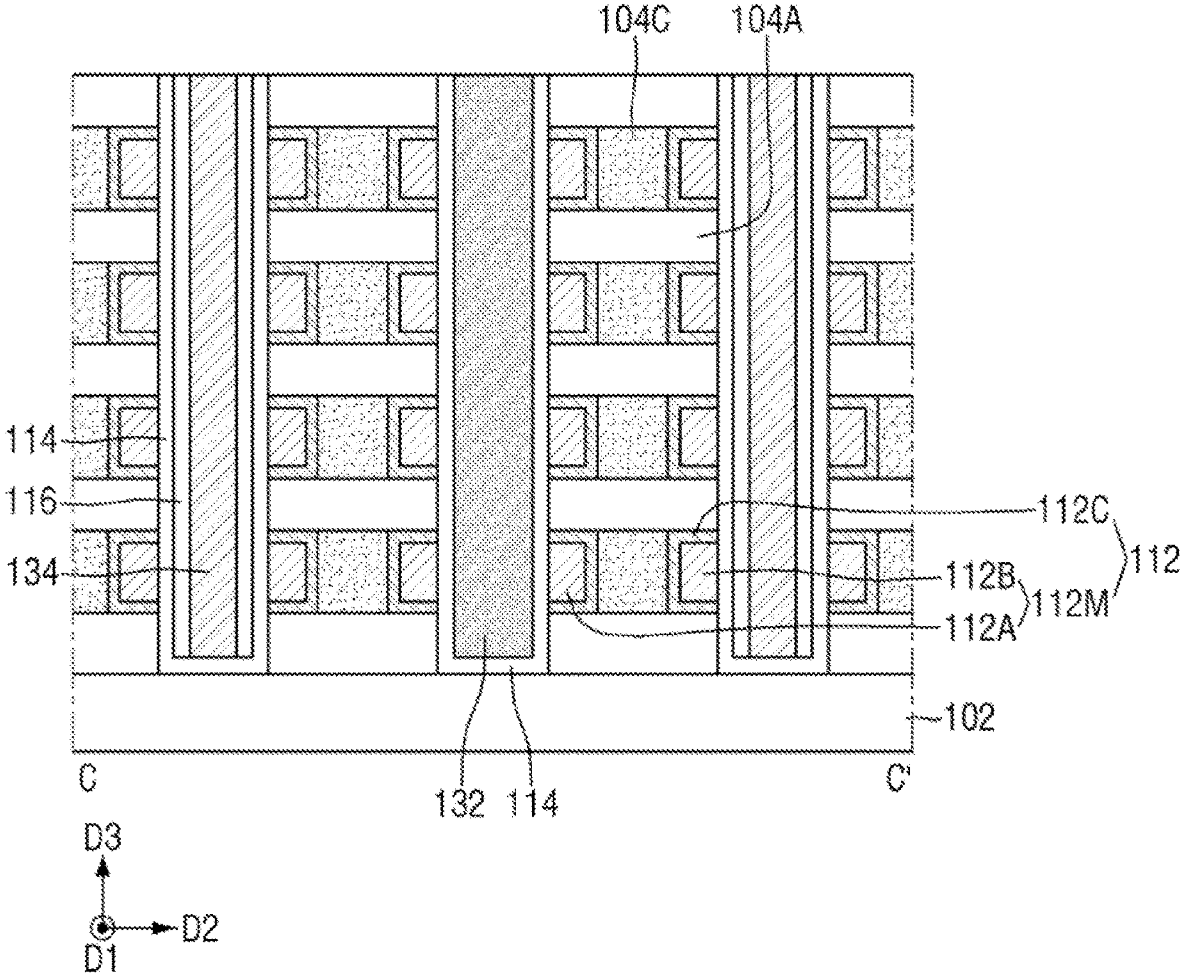

Referring to FIGS. 18 and 19, in some embodiments, the isolation plug 132 penetrates through the first dielectric layer 118 and the semiconductor layer 116 and extends in the third direction D3. A first opening that penetrates through the first dielectric layer 118 and the semiconductor layer 116 is formed in the third trench 106T3, and a second dielectric layer is formed in the first opening to form the isolation plug 132.

The first opening is formed using one or more known photolithography or etching processes. One or more dielectric materials are formed in the first opening. For example, the dielectric material includes at least one of an oxide such as silicon oxide, a nitride such as silicon nitride, a carbide such as silicon carbide, or silicon oxynitride, silicon oxycarbide, silicon carbonitride, or their combination.

The isolation plug 132 is an isolation column disposed between adjacent transistors 68, and physically and electrically isolates the adjacent transistors 68.

Each isolation plug 132 is disposed between the bit line 64 of a transistor 68 and the source line 66 of another transistor 68. For example, the bit line 64 and the source line 66 are disposed on opposite sides of each isolation plug 132. Thus, each isolation plug 132 physically and electrically isolates adjacent transistors 68.

In some embodiments, the isolation plug 132 does not extend by penetrating through the ferroelectric layer 114. Alternatively, in some embodiments, the isolation plug 132 is formed that penetrates through the ferroelectric layer 114. For example, the isolation plug 132 further extends and penetrates through at least a portion of the first insulating layer 104A and the second insulating layer 104B.

The second conductive line 134 and the third conductive line 136 are formed that penetrate through the first dielectric layer 118 and extend in the third direction D3.

To form the second conductive line 134 and the third conductive line 136, a second opening for the second conductive line 134 and the third conductive line 136 is formed by passing through the first dielectric layer 118. The second opening is formed using one or more known photolithography and/or etching processes.

A conductive material is formed in the second opening. For example, the conductive material includes metals, such as one or more of tungsten, cobalt, aluminum, nickel, copper, silver, gold or their alloys.

Each of the second conductive line 134 and the third conductive line 136 includes an adhesive layer and a main conductive layer on the adhesive layer, similar to the first conductive line 112, but embodiments of the present disclosure are not necessarily limited thereto.

Figure 20:
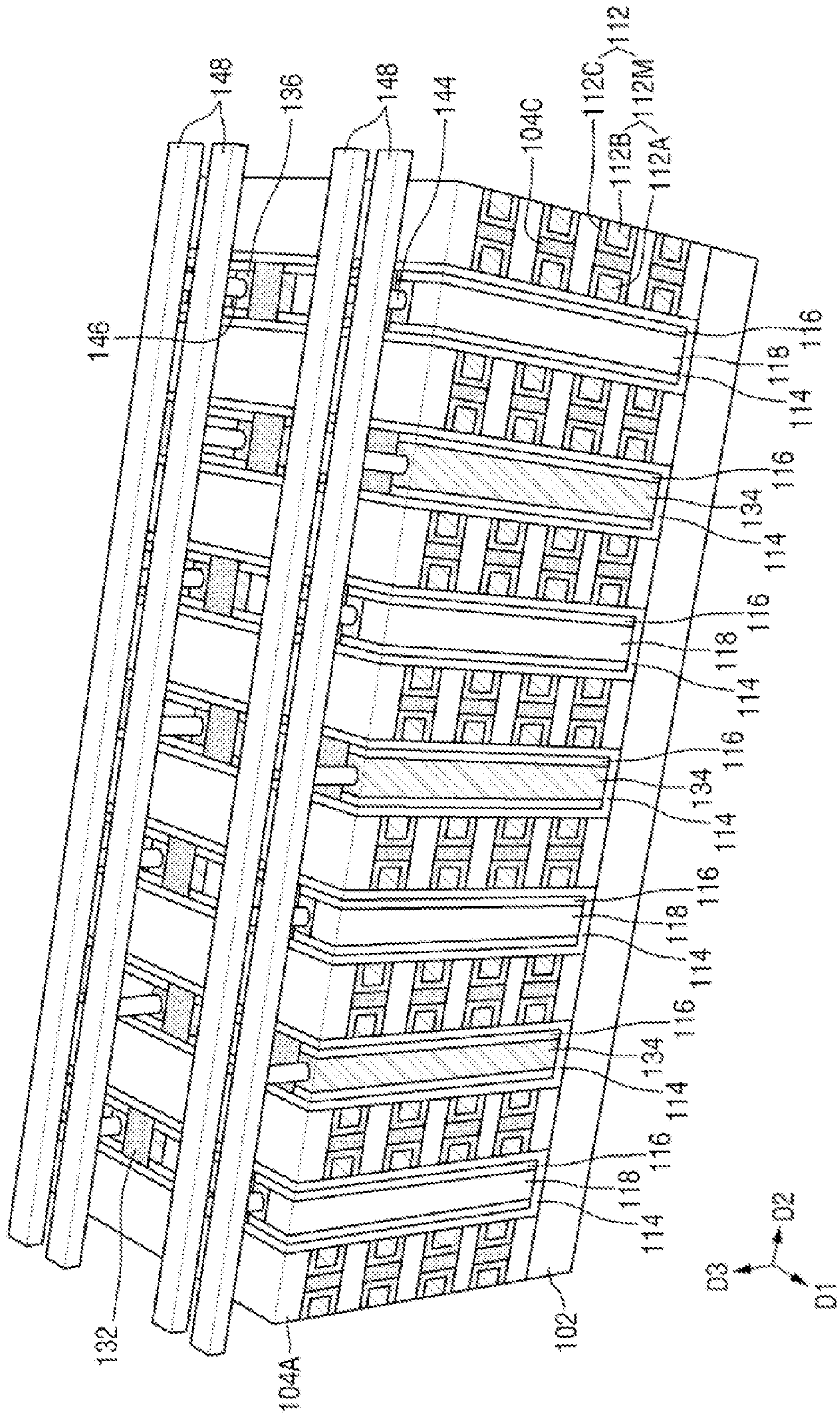
Figure 21:
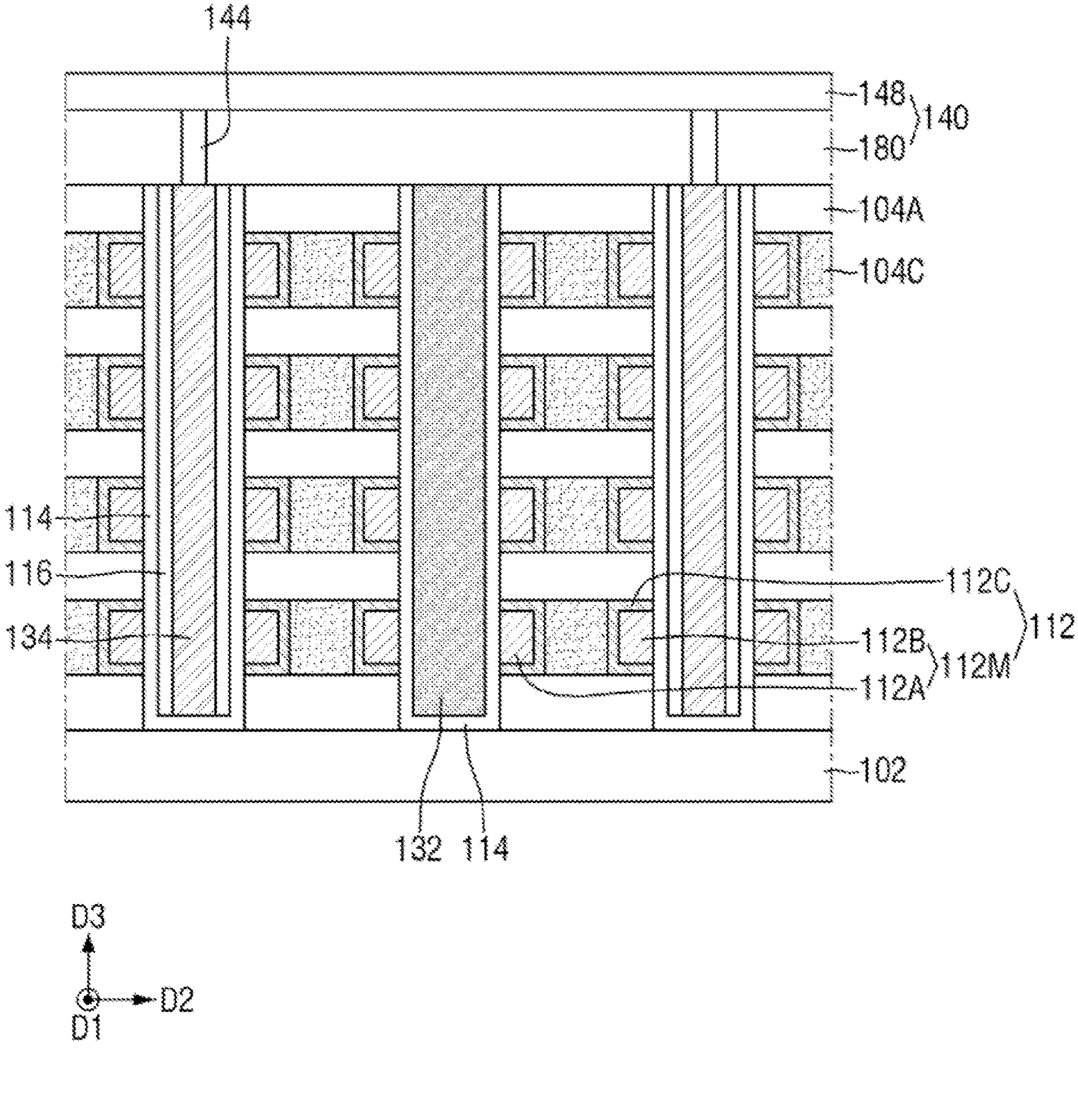

Referring to FIGS. 20 and 21, in some embodiments, the upper line structure 140 is formed on the stacked structure 104. For example, referring to FIGS. 5 and 21, the upper line structure 140 includes an interlayer insulating layer 180, a plurality of insulating layers 141, and a line pad 148.

The line pad 148 is electrically connected to the second conductive line 134 and the third conductive line 136. The third contact 146 is a via that electrically connects the upper line structure 140 with the third conductive line 136.

The plurality of insulating layers 141 include a dielectric material. The plurality of insulating layers 141 include one or more dielectric layers. The line pad 148 include a conductive material.

Therefore, a semiconductor device described using FIG. 4 can be formed. According to some embodiments, the number of processes for replacing the sacrificial layer with the word line can be reduced. Further, the number of subsequent processes for forming the ferroelectric layer, the semiconductor layer and the dielectric layer can be reduced.

Although the embodiments of the present disclosure have been described with reference to the accompanying drawings, it will be apparent to those skilled in the art that embodiments of the present disclosure can take various forms without being limited to the above-described embodiments and can be embodied in other specific forms without departing from the spirit and essential characteristics of embodiments of the disclosure. Thus, the above embodiments are to be considered in all respects as illustrative and not restrictive.

What is claimed is:

1. A semiconductor device, comprising:

a substrate that extends in first and second directions that cross each other, wherein the substrate includes a cell region and an extension region that extends from the cell region in the first direction;

first and second insulating layers alternately stacked on the substrate in a third direction that crosses the first and second directions;

a conductive line disposed on one sidewall of the second insulating layer in the second direction;

a conductive pillar that extends in the third direction and penetrates through the first insulating layer;

a semiconductor layer disposed on one sidewall of the conductive pillar and that extends in the third direction;

a first contact connected to the conductive line and that extends in the third direction on the conductive line; and a ferroelectric layer disposed between the conductive line and the semiconductor layer and that extends in the third direction, wherein the conductive line includes first and second conductive patterns spaced apart from each other in the second direction, and the second insulating layer is disposed between the first and second conductive patterns, wherein the conductive line in the extension region has first and second regions alternatively arranged in the first direction, wherein the first contact is connected to the first region, and wherein the second insulating layer is disposed in the second region, wherein the conductive line has a stepwise shape in the extension region, and wherein the first contact is not formed in the second region, and wherein the second insulating layer is not disposed in the first region.

2. The semiconductor device of claim 1, wherein the conductive line in the extension region has a different width in the second direction from that of the conductive line in the cell region.

3. The semiconductor device of claim 1, wherein a width in the second direction of the first region is less than that of the second region.

4. The semiconductor device of claim 1, wherein the conductive line in the extension region has a smaller width in the second direction than the conductive line in the cell region.

5. The semiconductor device of claim 4, wherein the second insulating layer is disposed in the cell region, and the second insulating layer is not disposed in the extension region.

6. The semiconductor device of claim 1, wherein the conductive line further includes an adhesive layer respectively disposed between the first conductive pattern and the second insulating layer and between the second conductive pattern and the second insulating layer.

7. The semiconductor device of claim 1, wherein the conductive pillar includes a plurality of conductive pillars spaced apart from each other in the first direction, and the semiconductor device further comprises an isolation plug disposed between the plurality of conductive pillars and that extends in the third direction.

8. The semiconductor device of claim 1, wherein the first and second conductive patterns include tungsten (W), and the second insulating layer includes silicon nitride (SiN).

9. A semiconductor device, comprising:

a substrate that includes a cell region that extends in first and second directions that cross each other and includes a ferroelectric memory cell formed thereon, and an extension region that extends from the cell region in the first direction;

a first conductive line that extends in the first direction on the substrate;

a plurality of second conductive lines spaced apart from the first conductive line in the second direction and spaced apart from each other in the first direction;

a ferroelectric layer disposed between one sidewall of the first conductive line and the plurality of second conductive lines and that extends in the first direction;

a semiconductor layer disposed between the ferroelectric layer and the plurality of second conductive lines and that extends in the first direction;

a first contact connected to the first conductive line on the first conductive line, and extending in a third direction that crosses the first and second directions; and an isolation plug disposed between the plurality of second conductive lines, wherein the first conductive line includes a plurality of first and second conductive patterns spaced apart from each other in the second direction, and a silicon material layer that extends in the first direction and is disposed between the first and second conductive patterns wherein the first conductive line in the extension region has first and second regions alternatively arranged in the first direction, wherein the first contact is connected to the first region, and wherein the silicon material layer is disposed in the second region, wherein the first conductive line has a stepwise shape in the extension region, wherein the first contact is not formed in the second region, wherein a width in the second direction of the first region is less than that of the second region, and wherein the silicon material layer is not disposed in the first region.

10. The semiconductor device of claim 9, wherein the first conductive line further includes an uneven structure in a plan view.

11. The semiconductor device of claim 9, wherein the first conductive line in the extension region has a different width in the second direction from that of the first conductive line in the cell region.

12. The semiconductor device of claim 9, wherein the silicon material layer includes a plurality of silicon material layers spaced apart from each other in the first direction.

13. The semiconductor device of claim 9, wherein the first conductive line in the extension region has a smaller width in the second direction than the first conductive line in the cell region.

14. A method of fabricating a semiconductor device, the method comprising:

forming a stacked structure on a substrate, wherein the stacked structure includes an insulating layer and a sacrificial layer that are alternately stacked, and the substrate includes a cell region and an extension region;

forming first and second trenches that penetrate through at least a portion of the stacked structure and are spaced apart from each other in a first direction, and a third trench between the first and second trenches;

forming a sacrificial pattern that has a smaller width than the sacrificial layer by partially removing the sacrificial layer;

forming a first conductive line that includes first and second conductive patterns that are spaced apart from each other on both sidewalls of the sacrificial pattern;

respectively forming a ferroelectric layer, a semiconductor layer and a first dielectric layer in the first to third trenches;

forming an opening that passes through the first dielectric layer and the semiconductor layer in the third trench;

forming a second dielectric layer within the opening;

forming a plurality of second conductive layers by respectively removing the first dielectric layers from the first and second trenches; and forming a first contact, on the first conductive line in the extension region, wherein the first conductive line in the extension region has first and second regions alternatively arranged in a second direction that crosses the first direction, wherein the first contact is disposed in the first region, and wherein the sacrificial pattern is disposed in the second region, wherein the first contact is not formed in the second region, and wherein more of the sacrificial layer is removed from the first region than from the second region.

15. The method of claim 14, wherein the sacrificial pattern includes a material that has as etch selectivity with respect to the insulating layer.

16. The method of claim 14, wherein a length of the sacrificial layer removed from the extension region is less than or equal to a sum of a length of the sacrificial layer removed to form the first conductive pattern in the cell region and a length of the sacrificial layer removed to form the second conductive pattern in the cell region.

* * * * *